(12) United States Patent
Kurahashi et al.

(10) Patent No.: US 10,715,165 B2
(45) Date of Patent: Jul. 14, 2020

(54) HIGH-SPEED ANALOG-TO-DIGITAL CONVERTER

(71) Applicant: Intel Corporation, Santa Clara, CA (US)

(72) Inventors: Peter Tsugio Kurahashi, Portland, OR (US); Cho-ying Lu, Hillsboro, OR (US); Triveni Suryakant Rane, Hillsboro, OR (US); Carlos Fernando Nieva-Lozano, Beaverton, OR (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/191,427

(22) Filed: Nov. 14, 2018

(65) Prior Publication Data

US 2019/0081635 A1    Mar. 14, 2019

(51) Int. Cl.

| | |
|---|---|
| *H03M 1/00* | (2006.01) |
| *H03M 1/12* | (2006.01) |
| *H03M 1/38* | (2006.01) |
| *H03M 1/46* | (2006.01) |
| *H04L 12/933* | (2013.01) |
| *H03K 5/24* | (2006.01) |
| *H03M 1/10* | (2006.01) |

(52) U.S. Cl.
CPC ......... *H03M 1/1215* (2013.01); *H03M 1/125* (2013.01); *H03M 1/38* (2013.01); *H03M 1/468* (2013.01); *H03K 5/249* (2013.01); *H03M 1/00* (2013.01); *H03M 1/10* (2013.01); *H03M 1/12* (2013.01); *H03M 1/124* (2013.01); *H04L 49/15* (2013.01)

(58) Field of Classification Search
CPC ............ H03M 1/12; H03M 1/00; H03M 1/10; H03M 1/124
USPC ................. 341/141, 166, 155, 120, 122, 158
See application file for complete search history.

(56) References Cited

U.S. PATENT DOCUMENTS

| | | | | |
|---|---|---|---|---|
| 6,044,063 | A * | 3/2000 | Kolagotla | G06F 7/026 340/146.2 |
| 9,608,652 | B2 * | 3/2017 | Lee | H03M 1/002 |
| 2012/0326901 | A1 * | 12/2012 | Zhao | H03M 1/0604 341/118 |

OTHER PUBLICATIONS

Ensafdaran, Masoud, et al., "High Speed SAR ADC Using Fast Conversion Loop," 2014 IEEE Radio and Wireless Symposium (RWS), Newport Beach, CA, Jan. 2014; 3 pages.

(Continued)

*Primary Examiner* — Joseph J Lauture
(74) *Attorney, Agent, or Firm* — Patent Capital Group

(57) ABSTRACT

There is disclosed in one example a communication apparatus, including: an analog data source; a digital communication interface; and an analog-to-digital converter (ADC) circuit assembly, including: an analog sample input; an input clock to provide frequency $f_{in}$; a time-interleaved front end to interleave n samples of the analog sample input; and an ADC array including n successive-approximation register (SAR) ADCs, the SAR ADCs including self-clocked comparators and configured to operate at a frequency no less than $$\frac{f_{in}}{n}.$$

20 Claims, 16 Drawing Sheets

(56) References Cited

OTHER PUBLICATIONS

Kull, Lukas, et al., "Implementation of Low-Power 6-8 b 30-90 CS/s Time-Interleaved ADCs with Optimized Input Bandwidth in 32 nm CMOS," IEEE Journal of Solid-State Circuits, vol. 51, No. 3, Mar. 2016; 13 pages.

* cited by examiner

HIGH-SPEED ANALOG-TO-DIGITAL CONVERTER

FIELD OF THE SPECIFICATION

This disclosure relates in general to the field of high-speed communication, and more particularly, though not exclusively, to a system for providing a high-speed analog-to-digital converter.

BACKGROUND

Interconnects provide communication between computing elements in a computing system.

BRIEF DESCRIPTION OF THE DRAWINGS

The present disclosure is best understood from the following detailed description when read with the accompanying FIGURES. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
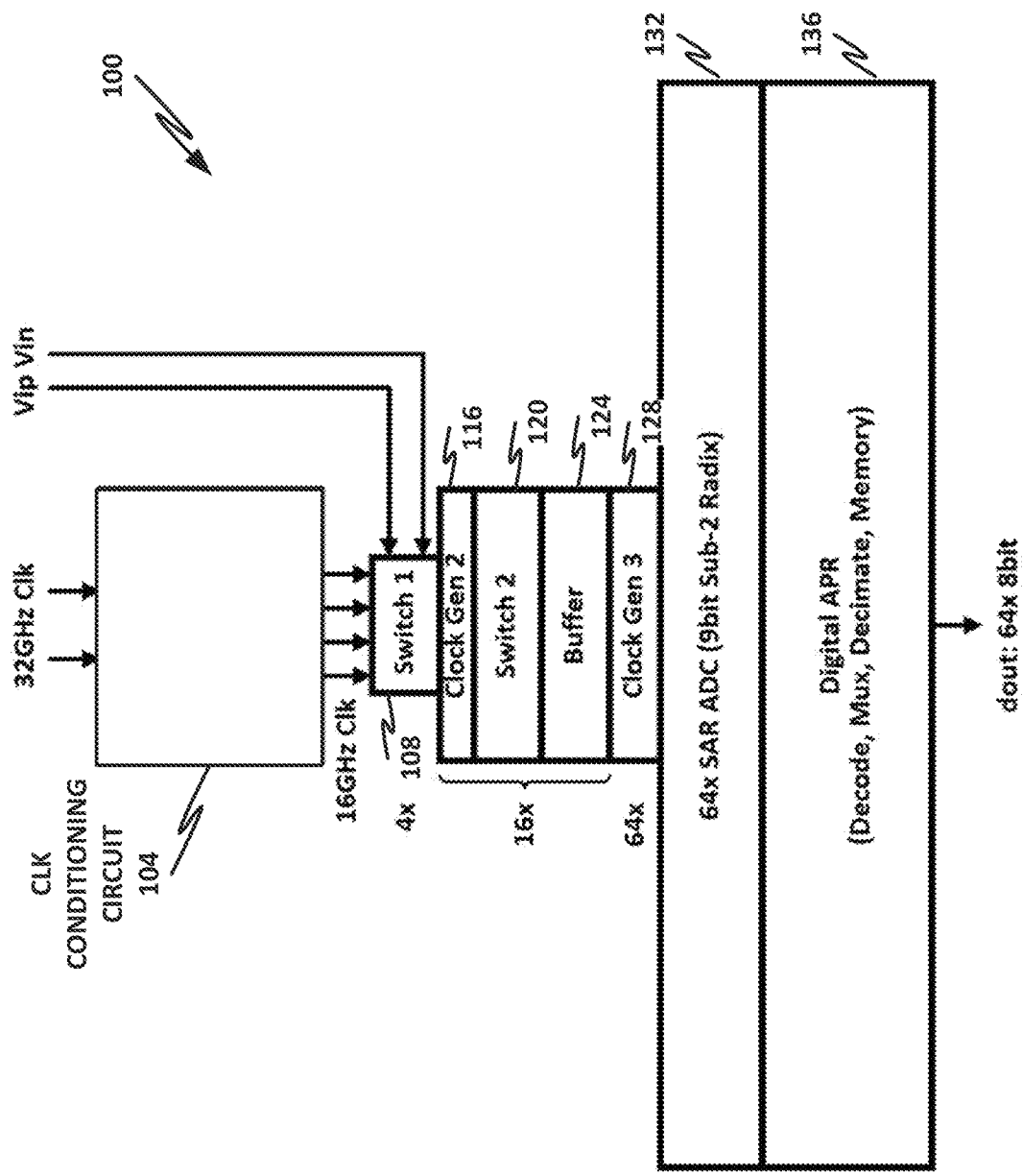
FIG. 1 is a block diagram of a high-level analog-to-digital converter (ADC) architecture.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different FIGURES. This repetition is for the purpose of simplicity and clarity and does not in itself dictate a specific relationship between the various embodiments and/or configurations discussed. Different embodiments may have different advantages, and no particular advantage is necessarily required of any embodiment.

A contemporary computing platform may include a complex and multi-faceted hardware platform provided by Intel®, another vendor, or combinations of different hardware from different vendors. For example, in a large data center such as may be provided by a cloud service provider (CSP) or a high-performance computing (HPC) cluster, the hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by flexibility to dynamically assign resources according to current workloads and needs. This can be accomplished, for example, by assigning a compute workload to a guest device, wherein resources such as hardware, storage, and networks are provided to a virtual machine, container, or disaggregated node by way of nonlimiting example.

In embodiments of the present disclosure, a processor may include any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

Next generation computing networks are driving increasing demand for the volume of data that are to be moved within a data center rack or within a high-performance computing (HPC) cluster. This demand is accelerated with the increase of applications requiring deep learning (DL) and artificial intelligence (AI). The challenge is further compounded by the fact that, as the volumes of data that are being moved between nodes in a computing cluster or rack are increasing, there is also an expectation from consumers that overall bandwidth will increase and latency will decrease. This creates pressure on data center speeds from two directions, namely an increase in data and an expected decrease in latency.

One challenge in designing high-speed networks is that traditional copper-based electrical communication interfaces may be inadequate to support the required speeds, while higher-speed fiber optic interconnects may be prohibitively expensive. It is therefore desirable in many contexts to provide an intermediate solution that can bridge the gap between copper electrical interconnects and fiber optic interconnects. These can be used, in particular, between nodes on a rack or between racks and switches, where the interconnect distances are up to a few meters long. Dielectric millimeter or sub-terahertz waveguides can be provided as interconnects to support millimeter waves and sub-terahertz communication. In particular, these waveguides can provide communication on the order of approximately 50 gigahertz (GHz), up to approximately 1 terahertz (THz). Advantageously, the waveguides themselves and the circuitry to drive the communication are less expensive than the cost of providing fiber optic interconnects, but support much higher speeds than copper-based electrical interconnects can provide at these frequencies and distances.

Dielectric waveguides as part of the interconnect fabric can be used to support applications such as data center, rack scale design, and HPC computing environments. Millimeter wave and terahertz transceivers responsible for modulating/demodulating and upconverting/downconverting digital data are an integral part of those interconnects. Wideband communication employing waveguides may demand very high sampling rate support to recover the received millimeter wave/sub-terahertz signal. Furthermore, modern communication systems rely on complicated digital data modulation schemes to increase the data rate over a limited signal bandwidth. This digital modulation may also require high resolution. The teachings of the present specification provide a number of apparatuses and techniques to enable high-speed sampling rates in time interleaving schemes without causing major linearity degradation. The teachings described herein also relax conversion time requirements.

Many existing circuits for solving similar problems rely on multiple-sample-per-cycle per analog-to-digital converter (ADC) to relax the conversion time per ADC. This solution, however, requires multiple comparators, which inherently have different properties because of the reality of process variations. Because the comparators are not perfectly matched, offset correction between comparators is necessary to mitigate spur generation in the sample data. Timing error correction required in these schemes continuously observes the timing mismatch and continuously updates the timing correction to sustain high performance over the operation period. Maintaining corrections between these multiple comparators consumes power and increases the circuit complexity and circuit footprint, thus presenting compact, low-power circuit and system design.

In contrast, the system of the present specification provides a successive-approximation register (SAR) ADC, including a sub-2 radix capacitor digital-to-analog converter (DAC). The sub-2 radix provides reduced sensitivity to errors at the cost of an extra conversion cycle. Embodiments of this system also provide a self-clocked comparator. The self-clocked comparator asynchronously resets to provide the fastest possible conversion time. Furthermore, embodiments may provide asynchronous memory. The asynchronous memory cell captures data from the self-clocked comparator without the need for a dedicated clock or feedback to the comparator.

Advantageously, this system uses only one comparator and thus does not require offset correction between bits. No calibration is required, and the single comparator uses a relatively small area on the die while providing reduced power consumption. This power and surface area optimization is advantageous because many unit ADCs are used in a time-interleaved array. Further advantageously, the self-clocked comparator and asynchronous memory allow for very high-speed operation.

A system and method for providing a high-speed analog-to-digital converter will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram of a high-level analog-to-digital converter (ADC) architecture 100. The ADC of the present specification includes a time-interleaved (TI) front end and a back-end array of SAR ADCs. The TI front end uses a switch multiplexer and buffers to distribute samples of the input voltage to the back-end ADC array for conversion to digital representation.

Because of the large number of unit ADCs required to parallel process the high-speed data from the front end, in some instances, the individual ADC area and power are premium design considerations. To reduce the area, power, and complexity of the ADC array, a single-bit comparator SAR solution is used in embodiments of the present specification. This single-bit comparator (as opposed to a multi-bit comparator) has the advantage of creating a high-linearity output, because any offset in the comparator only causes offset of the output code instead of signal distortion. The single-bit comparator does not require any additional circuitry for offset calibration, thus reducing the area requirement and increasing the speed of the comparator.

The ADC performs a standard SAR operation. The differential input is sampled onto a capacitor DAC, and the comparator checks the polarity of the DAC output. The output of the comparator is then used to update the DAC code to reduce the differential DAC voltage. This continues for a predefined number of cycles, and the voltage is minimized. The DAC code gives a representation of the input signal. The DAC uses a sub-2 radix scaling to create overlap between codes and thus provide redundancy and reduce sensitivity to settling errors. The sub-2 radix DAC code is decoded using digital logic after the ADC.

High-level ADC architecture 100 receives a 32 GHz input clock and a differential input voltage represented by inputs $V_{ip}$ and $V_{ip}$, being respectively the positive and negative sides of the differential voltage input. The 32 GHz input clock is sampled by clock conditioning circuit 104, which samples both the rising and falling edges of the 32 GHz clock, thus providing an effective 64 GHz sample rate. Clock conditioning circuit 104 separates the 32 GHz input clock into four 16 GHz phases that are separated by a very accurate 90° phase shift from one another. Each phase is approximately 15 picoseconds out of phase with each other phase.

The 16 GHz clock phases are provided to switch 1 108. Switch 1 108 may be an array of switches, providing effectively an analog multiplexer (MUX). Switch 1 108 takes a sample from the voltage waveform provided by $V_{ip}$ and $V_{in}$, and feeds it into a clocking front end comprising clock gen 2 116, switch 2 120, buffer 124, and clock gen 3 128. The clocking front end clocks the sampled voltage out to one of 64 SAR ADCs in SAR ADC array 132. SAR ADC array 132 provides an array of ADCs that operate at a minimum speed of 1 GHz each. The 64 individual ADCs are independent of one another, unlike in certain prior art embodiments, wherein samples are taken in parallel. When samples are taken in parallel, active circuitry may be required to compensate for clocking and voltage differences between the several parallel ADCs. This increases the surface area and complexity of the ADC. Furthermore, to minimize process variations between the parallel ADCs, they may need to be relatively large. This means that the parallel ADCs have higher internal capacitance, and more power is required to drive that higher capacitance.

But because SAR ADC array 132 provides an array of 64 effectively independent ADCs, there is no need to account for process variations between the various ADCs, and no requirement to provide active circuitry to compensate for those differences. Rather, the ADCs within SAR ADC array 132 operate in a time-interleaved manner. In other words, a first ADC within SAR ADC array 132 receives an input voltage sample, and operates on that voltage sample at an effective rate of at least 1 GHz. Approximately 15 picoseconds later, a second SAR ADC within array 132 receives the next voltage sample and begins operating on it at an effective rate of at least 1 GHz. This continues until all 64 ADCs within array 132 have received a voltage input. By the time the last ADC with an array 132 receives its input voltage, the first element within SAR ADC array 132 has completed its 1 GHz operation, and the digital output is ready for transmission. The first element then receives a new input from the differential input voltage and begins processing that input. 15 picoseconds later, the output from the second element of SAR ADC array 132 is ready, and is buffered out, while the second element receives a new sample from the differential input voltage. Thus, by time interleaving the outputs, an array of 1 GHz ADCs can independently operate on individual voltage samples at an effective rate of 1 GHz each, while the effective output through digital automatic place and route (APR) 136, including decoding, multiplexing, decimating, and memory storage, has an effective output of 64 GHz after the initial settling time of approximately 64 clock cycles. Thus, $d_{out}$ includes 64 8-bit bytes that are effectively clocked out at 64 GHz clock speed after the settling time.

This effectively distributes the very fast sampling rate among a large array of ADCs, which increases the time that each ADC has to operate on a sample. Thus, the input sample rate is effectively divided by 64 for each ADC operation.

Figure 2:
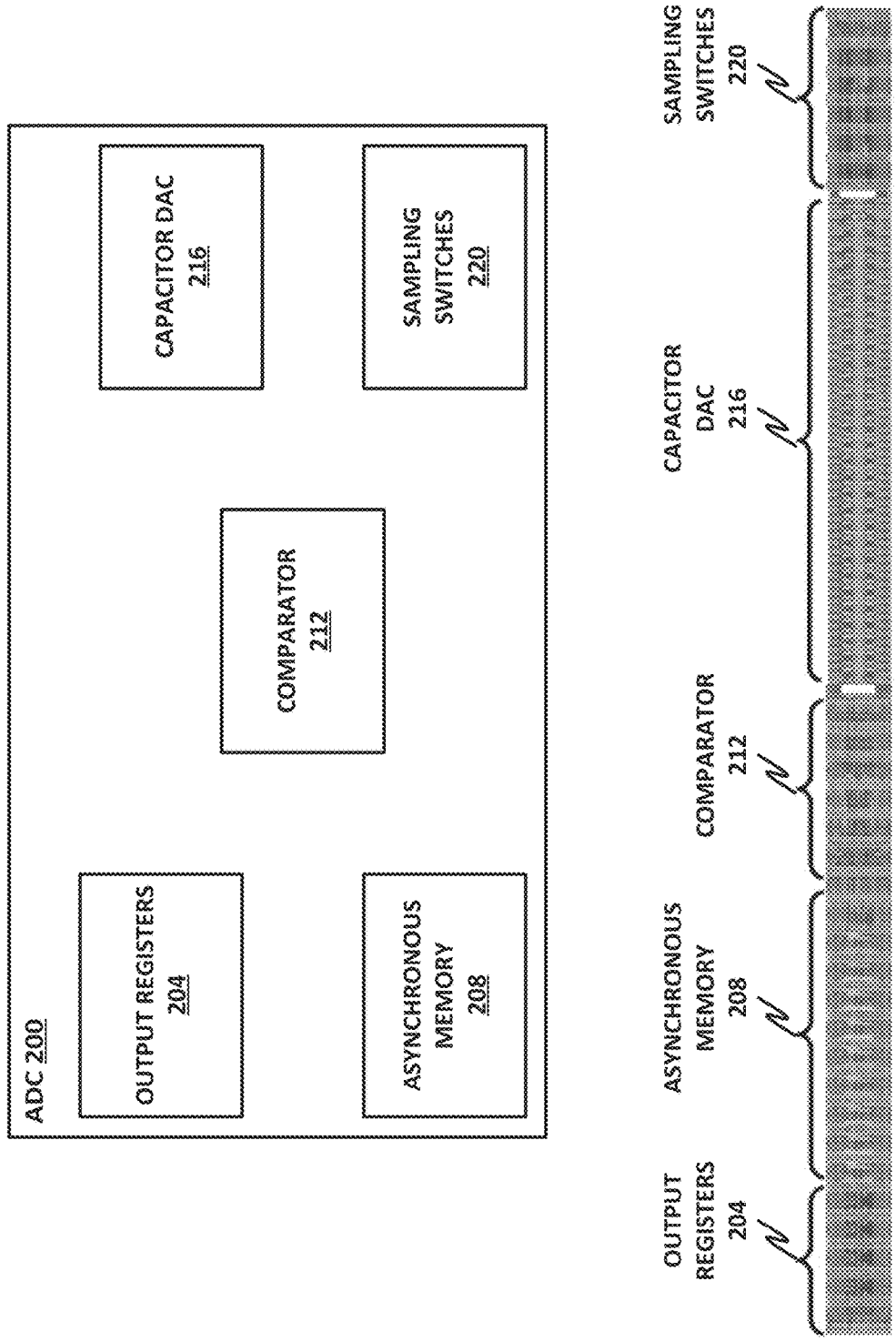
FIG. 2 is a block diagram of an ADC converter.

FIG. 2 is a block diagram of an ADC converter 200. ADC 200 may be an example or an embodiment of the ADCs within ADC array 132 of FIG. 1. Alternately, ADC 200 could be a different ADC. In one illustrative example, SAR ADC array 132 includes 64 instances of ADC 200 of FIG. 2.

ADC 200 includes a comparator 212, which can be used to sample the analog signal and drive appropriate digital outputs. This operation can be time-driven by sampling switches 220, while a sub-2 radix comprising capacitor digital-to-analog converters (DACs) 216 may help to prevent errors. Output registers 204 and asynchronous memory 208 provide the digital outputs usable by a digital system such as a computer.

FIG. 2 also illustrates an example of the physical placement of elements of ADC 200 in one illustrative process.

Figure 3:
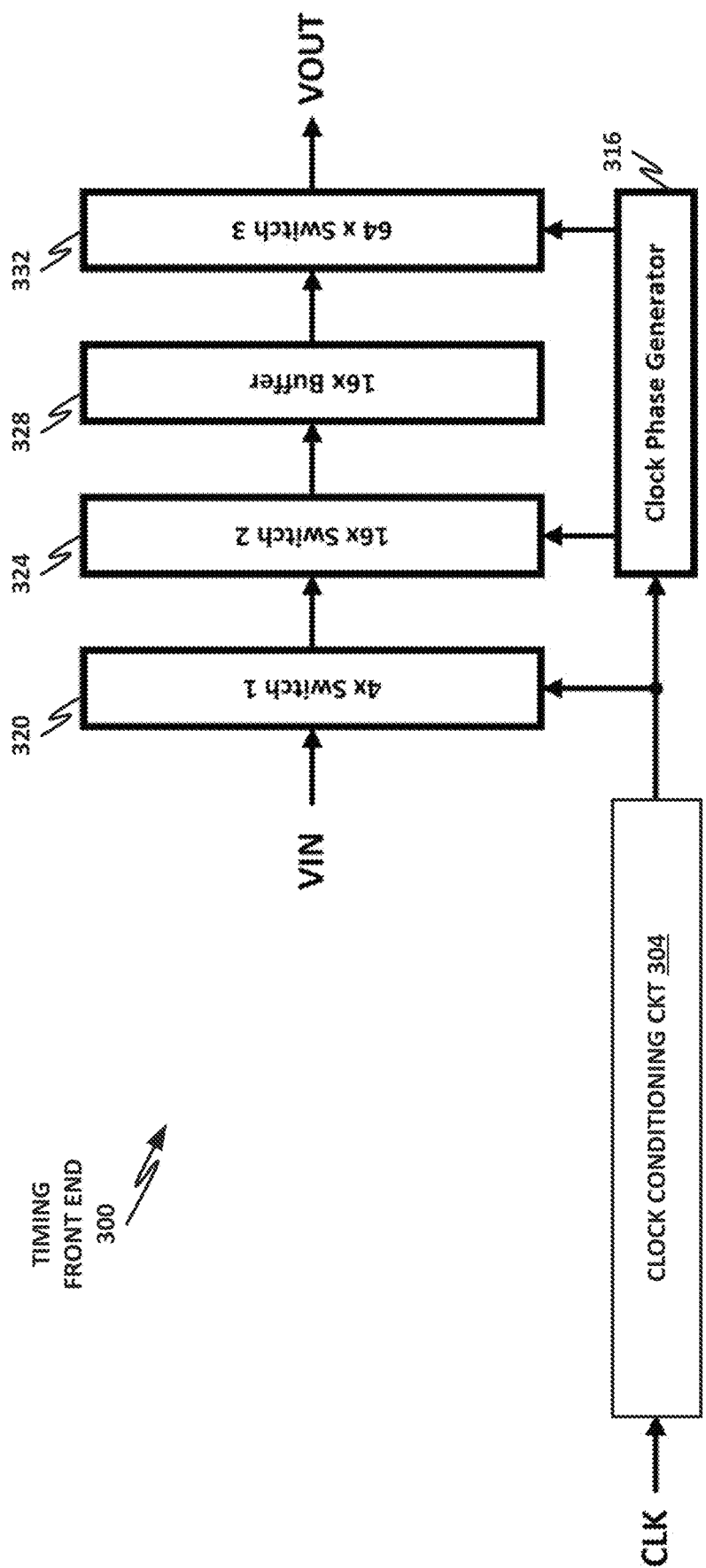
FIG. 3 is a block diagram illustrating details of a timing front end which may be used, for example, with an ADC architecture.

FIG. 3 is a block diagram illustrating details of a timing front end which may be used, for example, with ADC architecture 100 of FIG. 1.

As in FIG. 1, timing front end 300 receives an input clock at a speed such as 32 GHz. Clock conditioning circuit 304 samples the clock at both the rising and falling edges, and provides the effectively doubled clock to a clock phase generator 316. Clock phase generator 316 generates four 16 GHz clock signals, each one precisely 90° out of phase from each other. The phase shift for each clock division is approximately 15 picoseconds, in the case where the input clock is 32 GHz and the operating frequency is therefore 64 GHz.

$V_{in}$ may be a differential voltage input, comprising for example both a positive and negative voltage side to provide the differential voltage. $V_{in}$ is provided to a 4× switching array 320, from there to a 16× switching array 324, from there to a 16× buffer 328, from there to a 64Δ switch 332. The sampled voltage $V_{in}$ is therefore clocked out as $V_{out}$ at an effective rate of 64 GHz.

Figure 4:
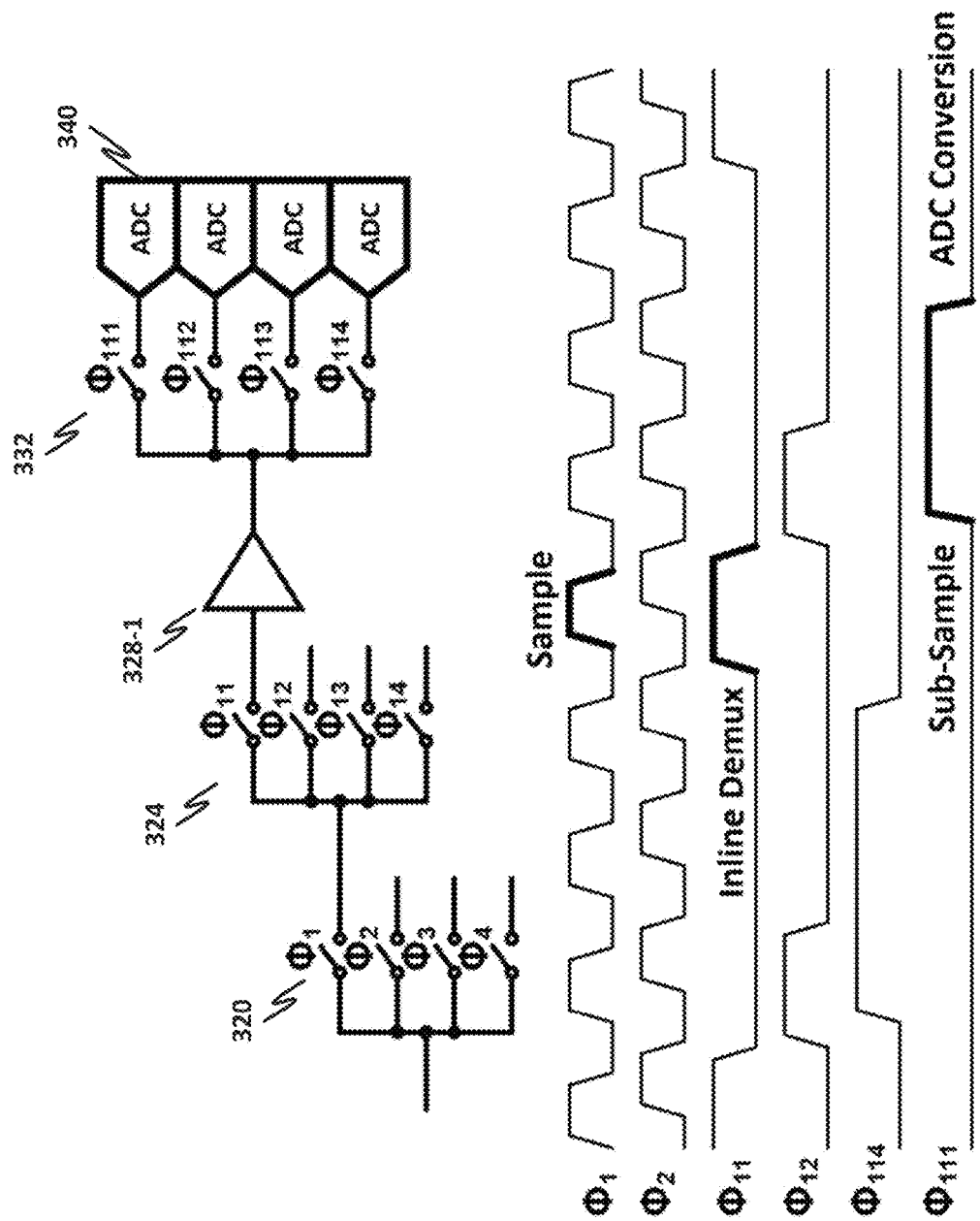
FIG. 4 is a block diagram illustration of switching to realize the timing of an analog-to-digital conversion.

FIG. 4 is a block diagram illustrating in more detail how switches 320, 324, and 332 of FIG. 3, along with buffer 328, operate.

The original clock signal is provided to a first switching array 320, comprising φ1, φ2, φ3, and φ4. Taking φ1 as an example, the sample is provided to switching array 324. Note that four separate switches are provided at the output of each switching array 320, such that φ1 drives φ1-1, φ1-2, φ1-3, and φ1-4, while φ2 drives φ2-1, φ2-2, etc. Although switching array 324 includes 16 elements, for simplicity of the illustration only four elements are shown here, specifically φ1-1, φ1-2, φ1-3, and φ1-4. In this case, φ1-1 is selected, and then provided to a buffer 328-1. Note that 16 individual buffers are provided for each of the 16 outputs of switching array 324. The buffered output is then provided to a 64× switching array 332. Note that, although 64 individual switches are provided in this array, for simplicity of the illustration only four switches are shown here.

As with switching array 324, switching array 332 includes four individual switches per output switch from switching array 324. In this case, switch φ1-1 drives switches φ1-1-1, φ1-1-2, φ1-1-3, and φ1-1-4, each of which couples individually to an ADC 340. Because the cascade of switches between 320, 324, and 332 effectively divides the clock rate by 64, each ADC 340 operates at a minimum clock speed of 1 GHz, and need not operate at the full 64 GHz clock speed. A timing diagram is included with this FIGURE to illustrate that a sample taken at φ1 is divided at φ1-1, and then provided to φ1-1-1 for ADC conversion at a much lower clock speed.

Figure 5:
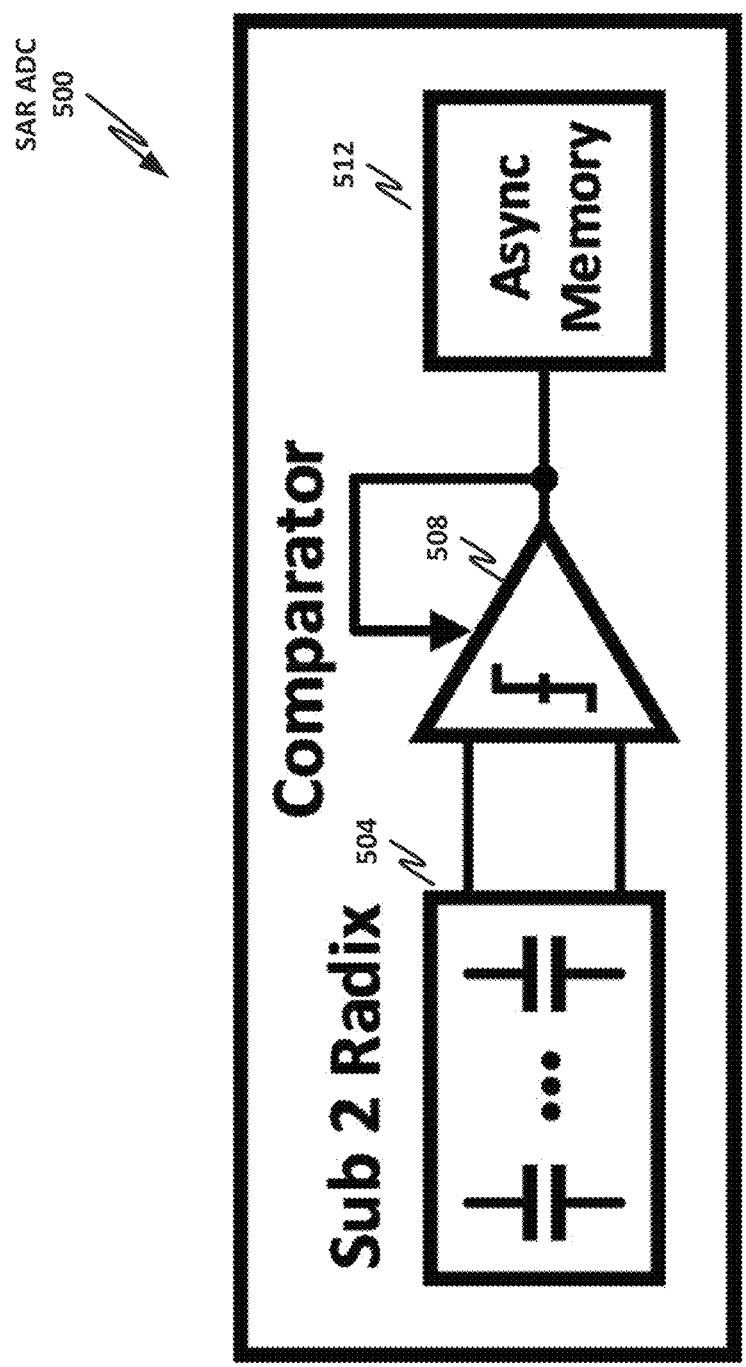
FIG. 5 is a block diagram of a successive-approximation register analog-to-digital converter (SAR ADC).

FIG. 5 is a block diagram of a successive-approximation register analog-to-digital converter (SAR ADC) 500. SAR ADC 500 includes a self-clocked comparator 508. An embodiment of self-clocked comparator 508 is illustrated in greater detail in FIG. 6. Asynchronous memory 512 captures data from self-clocked comparator 508, and drives a sub-2 radix ADC 504. Additional details of a sub-2 radix ADC network are illustrated, for example, in FIG. 7.

One aspect of sub-2 radix ADC 504 is that the number of capacitors it utilizes is larger than the number of ADC output bits. This provides redundancy, so that if an error occurs in a comparison, sub-2 radix ADC 504 can absorb any decision or settling error and still drive the correct answer out. In general, a binary ADC may require the same number of capacitors as output bits. However, if the number of capacitors in the SAR ADC strictly matches the number of output bits, then any error in any of the comparisons will be propagated to the output.

This is of particular concern in this case, because although SAR ADC 500 is being operated at a much slower clock rate than the overall ADC architecture, it is still a very fast rate for an ADC (e.g., 1 GHz). At 1 GHz, the capacitors of sub-2 radix ADC 504 may not have time to settle completely between samples. Thus, in some embodiments, it is essentially inevitable that errors will show up in some of the comparisons. The extra or "redundant" capacitor of sub-2 radix ADC 504 ensures that when errors occur because capacitors do not have time to settle completely, those errors will not be propagated to the output.

Figure 6:
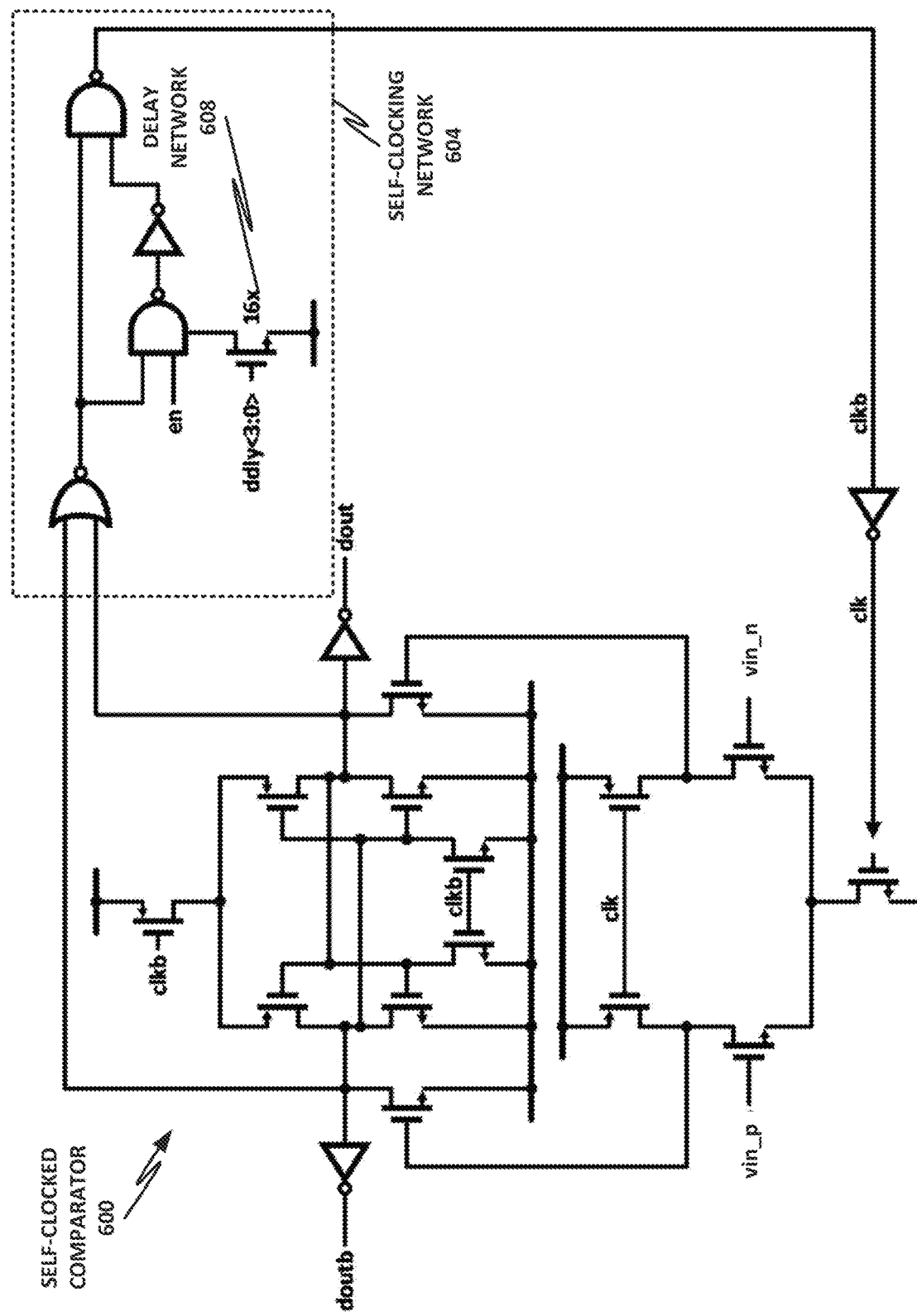
FIG. 6 is a block diagram of a self-clocked comparator.

FIG. 6 is a block diagram of a self-clocked comparator 600. Note that self-clocked comparator 600 is clocked by clock signals "clk" and "clkb." In the embodiment illustrated, clock signal clk is not a traditional clock signal. Rather, it is generated from feedback clock signal clkb with an inverter, wherein clock signal clkb is provided by self-clocking network 604. Self-clocked comparator 600 receives differential input voltage comprising $vin_p$ and $vin_n$, and performs a comparison.

Self-clocked comparator 600 is provided with a preamplifier stage for reduced kickback. The clock loop (e.g., self-clocking network 604) has a fast reset path and a programmable set path delay (e.g., delay network 608) to control the sampling time. Before conversion, the outputs of the comparator are pulled high. When a comparator decision is made, one of the differential outputs goes low.

In many respects, self-clocked comparator 600 provides a traditional preamplifier with a strong arm latch at the output. It includes a two-stage comparator, the architecture of which is known. However, self-clocked comparator 600 also includes novel features, including a self-clocking network 604. Self-clocking network 604 clocks out the result of each conversion to memory, and then feeds back a clock signal clkb to self-clocked comparator 500. Thus, after each comparison, self-clocked comparator 600 clocks out its output and then resets itself to take the next sample without any external clock input.

Note that this may require the asynchronous operating speed of self-clocked comparator 600 to closely match the operating speed of the input clock. Thus, a delay network 608 is also provided, with a four-bit "d delay" (ddly) digital input. This allows self-clocked comparator 600 to be tuned to compensate for process variations that may result in some instances of self-clocked comparator 600 being faster or slower than other instances.

Figure 7A:
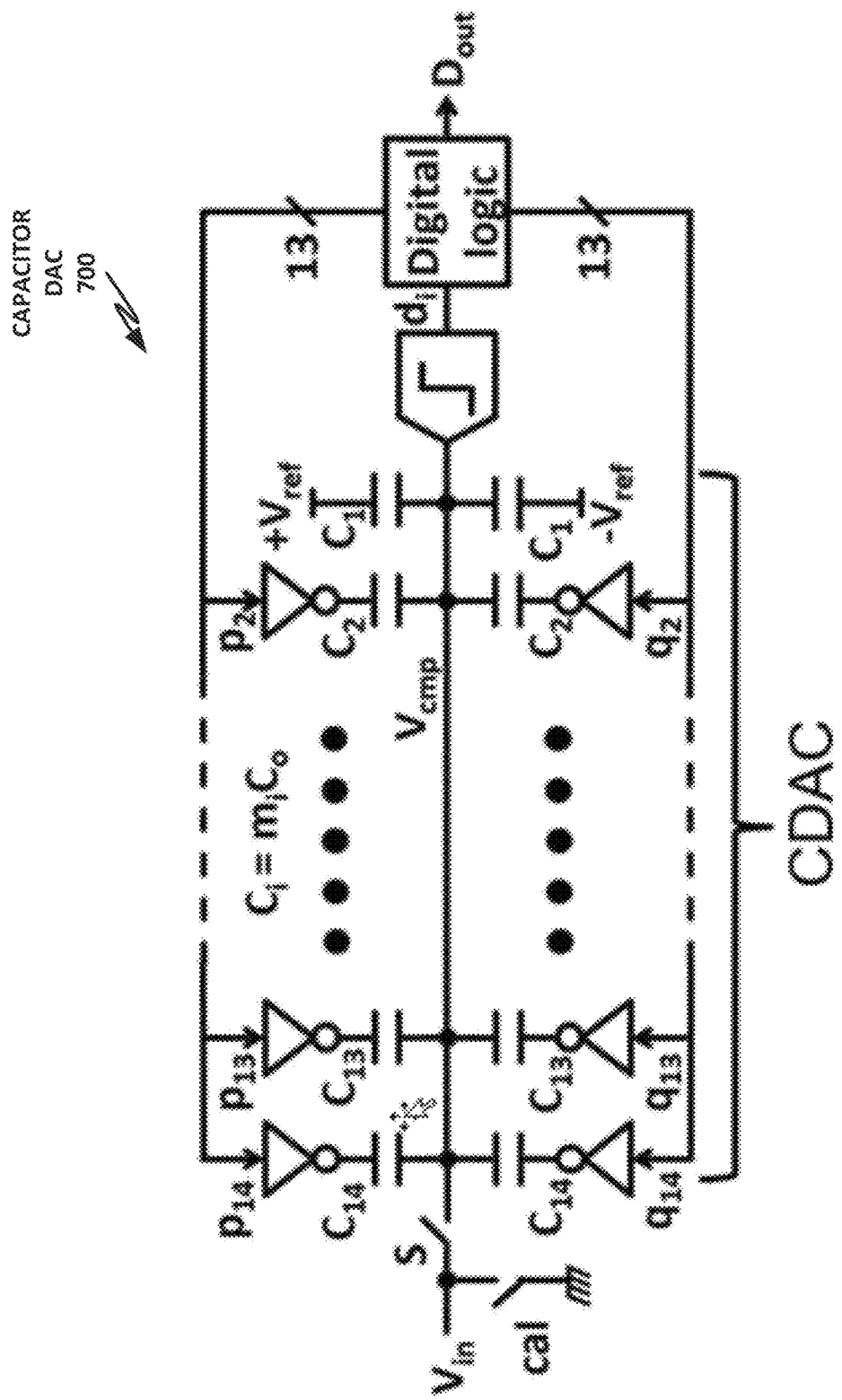
FIG. 7a is a block diagram of a capacitor digital-to-analog converter (DAC).

FIG. 7a is a block diagram of a capacitor digital-to-analog converter (DAC). Note that in capacitor DAC 700, rather than having just one capacitor for each bit, there are two capacitors provided for each bit. Note that both positive and negative voltage reference signals are provided to each capacitor.

Figure 7B:
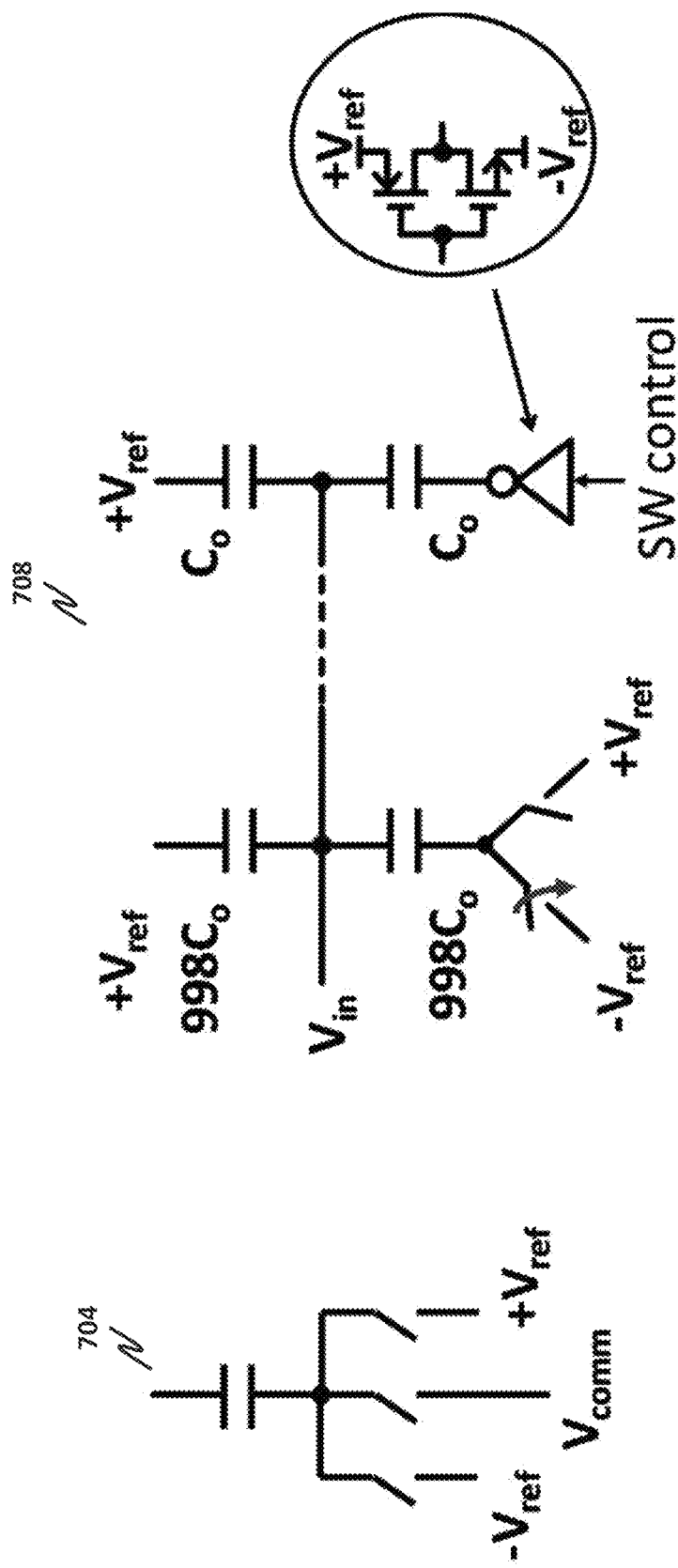
FIG. 7b is a block diagram illustrating an alternative embodiment of a DAC.

Turning to FIG. 7b, it is seen in network 704 that an alternative of realizing the same operation would include a single capacitor, with the voltage switch between a common and either a positive or negative reference voltage. But, as seen in network 708, when dual capacitors are used, there is no need to switch between the common, the positive voltage reference, and the negative voltage reference. In network 708, the first set of capacitors is initially held at $+V_{ref}$, while the second set of capacitors is initially held at $-V_{ref}$. Then, for a one-bit conversion, depending on whether the conversion turns out to be positive or negative, one side or the other is switched to the opposite polarity. Although this adds an extra capacitor, it removes the common voltage reference, and thus makes layout easier because there is no routing required for the common voltage reference. Note that in FIG. 10, there is a DACP (positive) and DACM (negative) signal coming from the memory interface. This is to drive both sides of capacitor DAC 700 of FIGS. 7a and 7b.

Figure 8:
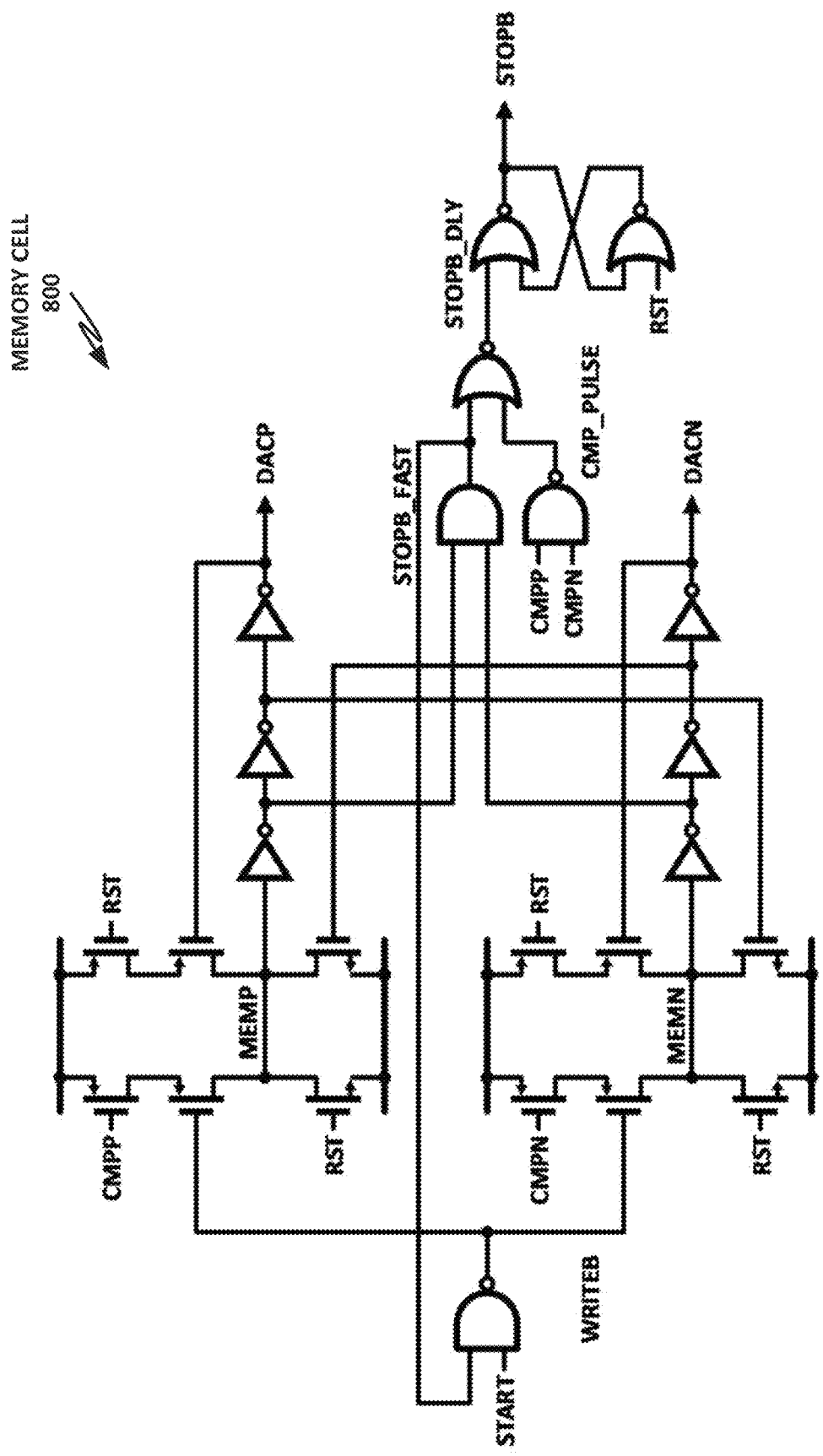
FIG. 8 is a block diagram of a memory cell.

FIG. 8 is a block diagram of a memory cell 800. Memory cell 800 includes two dynamic latches connected to each of the differential comparator outputs. The dynamic latches drive inverter buffers, which control both the static latch devices and capacitor DAC bits. The latches are synchronously reset, and consume no static current. Once enabled, the latches remain in a high impedance state until triggered. After they are triggered, they enter static latched state until reset. Digital logic at the write of memory cell 800 controls the start of the next memory cycle.

Figure 9:
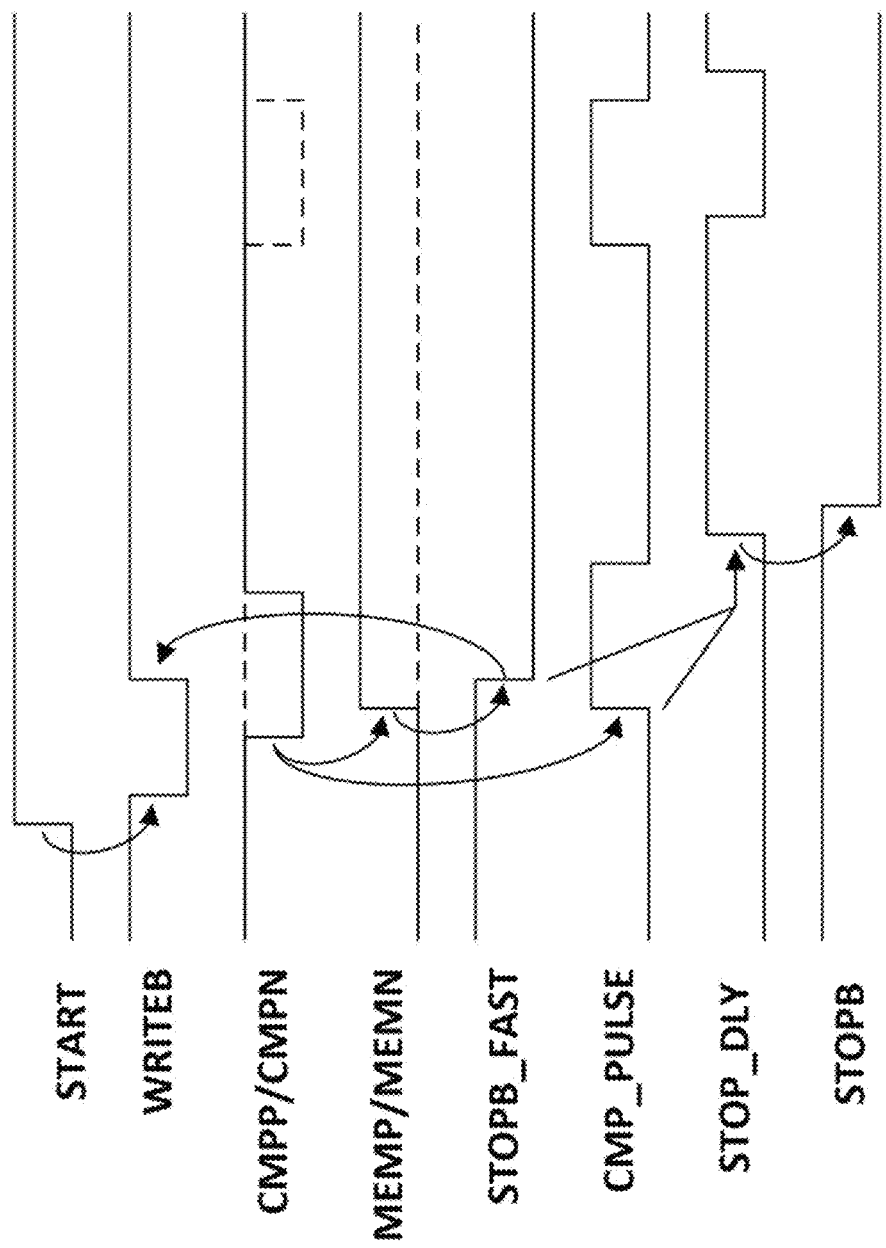
FIG. 9 is a timing diagram illustrating memory operations.

FIG. 9 is a timing diagram illustrating memory operations. The memory cell cycle starts when START goes high and WRITEB allows the latch to be driven by the comparator input. Both comparator inputs start high, and when a comparator decision is made, one of the comparator outputs goes low, depending on the comparator input polarity. This causes one of the dynamic latches to pull high. Once one of the dynamic latches transitions, the output inverters drive pull up/pull down devices to latch the memory into a static state. An AND operation is used on the inverter outputs as a signal that the data have been latched and a STOPB_FAST goes low to disconnect the latches from the comparator output. The comparator outputs also directly drive a NOT-AND (NAND) gate to produce comparator active signal CMP_PULSE. CMP_PULSE and STOPB_FAST drive a NOR gate to produce a signal called STOP_DLY. This signal only goes high once the latch operation is complete, and the comparator has returned to reset. This is used to signal the next stage that it is safe to start looking at the comparator output for the next comparator operation. An output latch is used on STOP_DLY because the comparator pulses from subsequent operations cause STOP_DLY to pulse, which can interfere with the writing of the next stage data.

Figure 10:
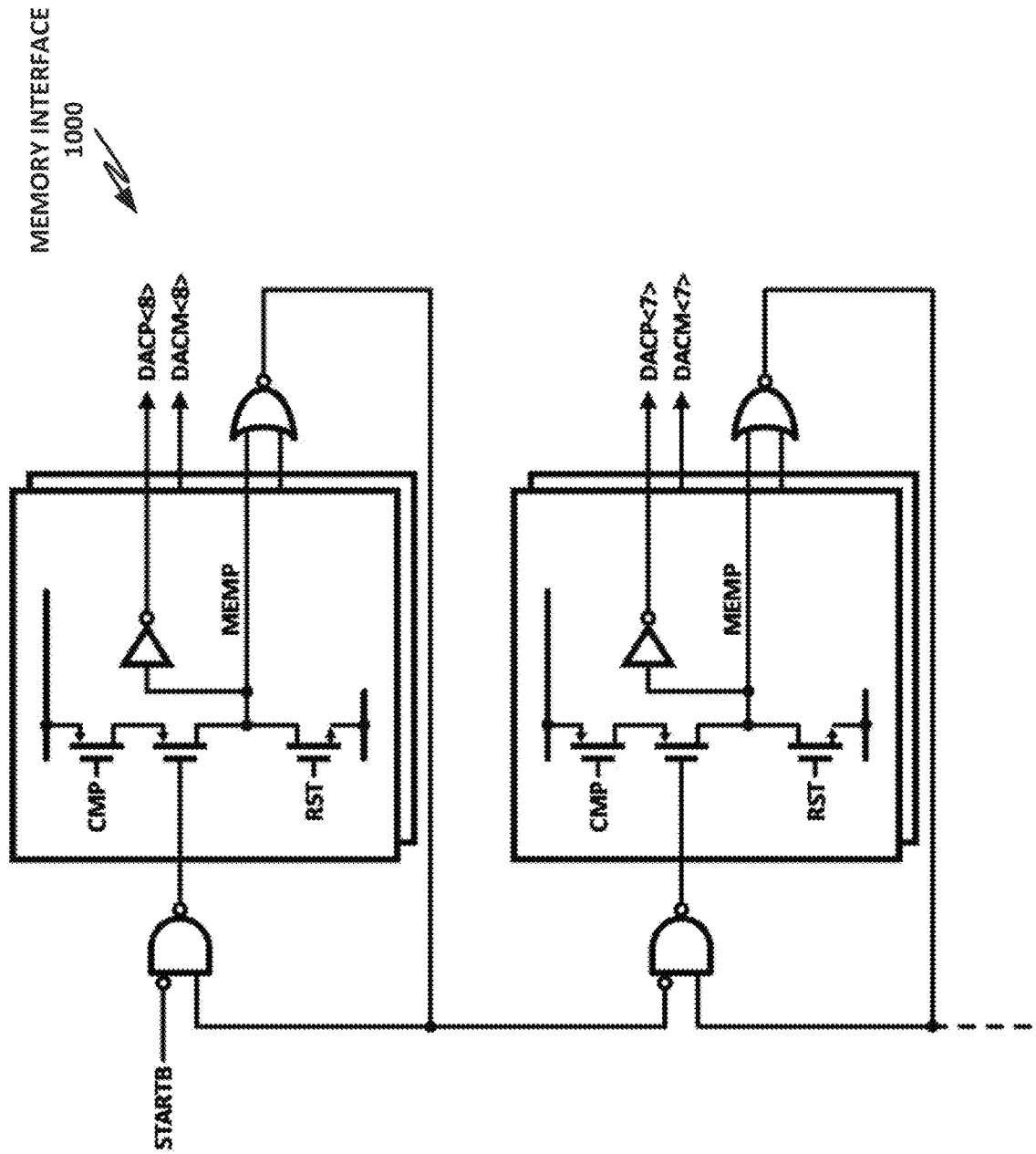
FIG. 10 is a block diagram of a memory interface.

FIG. 10 is a block diagram of a memory interface 1000. The dynamic memory is enabled at the beginning of a conversion cycle. All memory cells within memory interface 1000 are held in a high impedance state with the internal memory node pulled low in the first memory cell connected to the comparator output. When a comparator decision is made, one of the comparator outputs goes low and the first differential memory cell latches the decision.

The memory cell directly drives the capacitor DAC for a fast conversion cycle. The latching of the memory cell disables its connection to the comparator and enables the connection of the next memory cell in the chain to the comparator. The delay through the memory cell is faster than the delay through the comparator loop, so that the next memory cell is waiting for comparator data in time to latch the next comparator transition. This operation continues until all memory cells are latched and all DAC capacitors are set. The final memory cell output asynchronously triggers a set of flip-flops to sample the output data, and the memory cells are then all reset.

Figure 11:
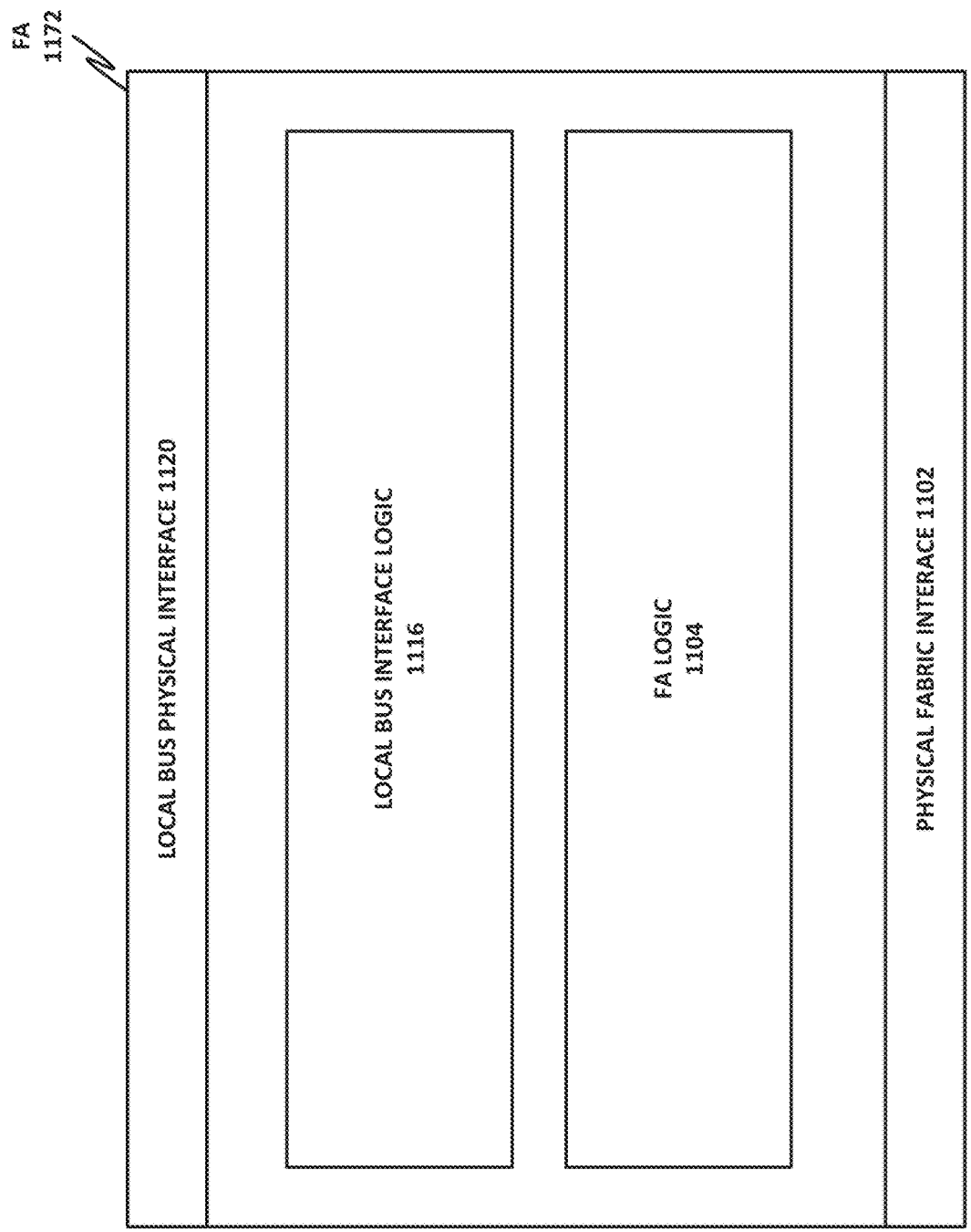
FIG. 11 is a block diagram of an example host fabric adapter (FA).

FIG. 11 is a block diagram of an example host fabric adapter (FA) 1172. Embodiments of FA 1172 disclosed herein may be adapted or configured to provide a high-speed ADC, according to the teachings of the present specification.

FA 1172 is provided by way of nonlimiting example only. It should be noted in particular that FA 1172 may be a separate pluggable card, such as a peripheral component interconnect express (PCIe) card, or it may be tightly integrated and on-die with its host core. Furthermore, while FA 1172 is disclosed herein as the medium for hosting remote hardware acceleration functions, these functions could just as well be hosted in another part of the machine. For example, a dedicated remote hardware accelerator (RHA) chip could be provided, which itself could be very much like a hardware accelerator. Functions could be performed on a hardware block integrated into the core, or these functions could be performed in software on the core. Thus, the disclosure of remote hardware acceleration functions on FA 1172 in this FIGURE should be understood as a non-limiting and illustrative example only, and the present disclosure should be understood to encompass any suitable hardware or software configuration for realizing remote hardware acceleration.

In this example, FA 1172 includes two physical interfaces, namely a local bus physical interface 1120 and a physical fabric interface 1102.

Local bus interface 1120 may provide a physical interface to a local bus on the host, such as a PCIe interface or other local interconnect. Local bus physical interface 1120 is provided as a nonlimiting example, and it should be understood that other interconnect methods are possible. For example, in cases where FA 1172 is tightly coupled with its accompanying core, local bus physical interface 1120 could be provided by direct, on-die trace lines, or direct copper connections on an integrated circuit board. In other examples, a bus interface other than PCIe could be used.

Figure 13:
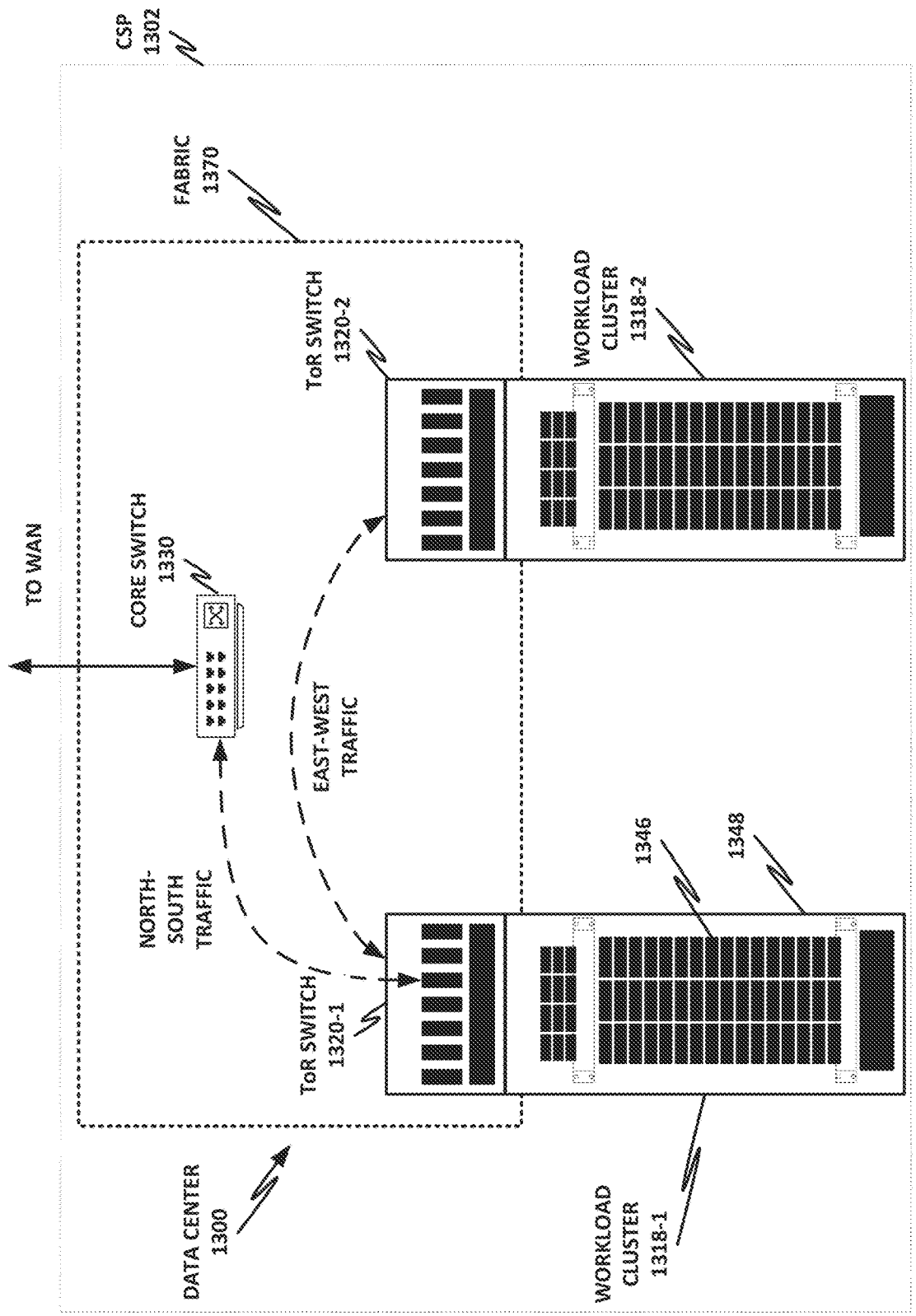
FIG. 13 is a block diagram illustrating selected components of a data center with network connectivity.

Physical fabric interface 1102 provides the physical interconnect to a fabric, such as fabric 1370 of FIG. 13 or any of the fabrics disclosed herein. Physical fabric interface 1102 may be configured to connect FA 1172 to any suitable fabric.

The fabric may include a dielectric waveguide-type fabric, along with other fabric elements, such as electrical interconnects. For an electrical interconnect, the Intel® Omni-Path™ fabric may be used. The Omni-Path™ fabric is advantageous because it allows mapping of addresses and memory ranges between different coherent domains. A system may include one or more coherent domains wherein all coherent domains are connected to each other via a fabric. Caching agents are the coherency agents within a node that process memory requests from cores within the same node, thus providing the coherency of the domain. Home agents are node clusters that are responsible for processing memory requests from the caching agents, and act as a home for part of the memory address space. Multiple homes may be provided on a single die with a distributed address space mapping. Depending on the address space that a request targets, the request may be routed to the same node's local memory, or it may go to an Intel® UltraPath Interconnect (UPI) agent, for example, which may route the request to other processors within the same coherent domain. Alternately, a request may go through the FA 1172 to processors that are outside the coherent domain. All processors connected via the UPI belong to the same coherent domain. Thus, in one embodiment, FA 1172 may communicate with an Omni-Path™ fabric via UPI tunneling.

In a waveguide interconnect, physical fabric interface 1102 may include waveguide launchers configured to launch the desired waveform onto the dielectric waveguide. In some embodiments, such as embodiments that use multimode communication or multiple-channel communication, a plurality of launchers may be provided to launch a plurality of waveforms.

This communication may be facilitated via FA logic 1104, which provides logic elements and instructions necessary to provide communication within a coherent domain, and across the fabric with different coherent domains. FA logic 1104 may also include logic to translate local requests into remote fabric requests. Embodiments of FA logic 1104 may include DACs for converting digital data to analog waveforms (e.g., for transmission out to the fabric), and ADCs for converting analog waveforms to digital data (e.g., for local consumption). The ADCs in FA logic 1104 may include the ADC of the present specification.

On the other hand, local bus interface logic 1116 may provide logic for interfacing with the local bus, such as a PCIe bus, or a dedicated copper connection. Alternately, traffic through FA 1172 may follow a path through local bus physical interface 1120, local bus interface logic 1116, FA logic 1104, and physical fabric interface 1102 out to the fabric.

Figure 12:
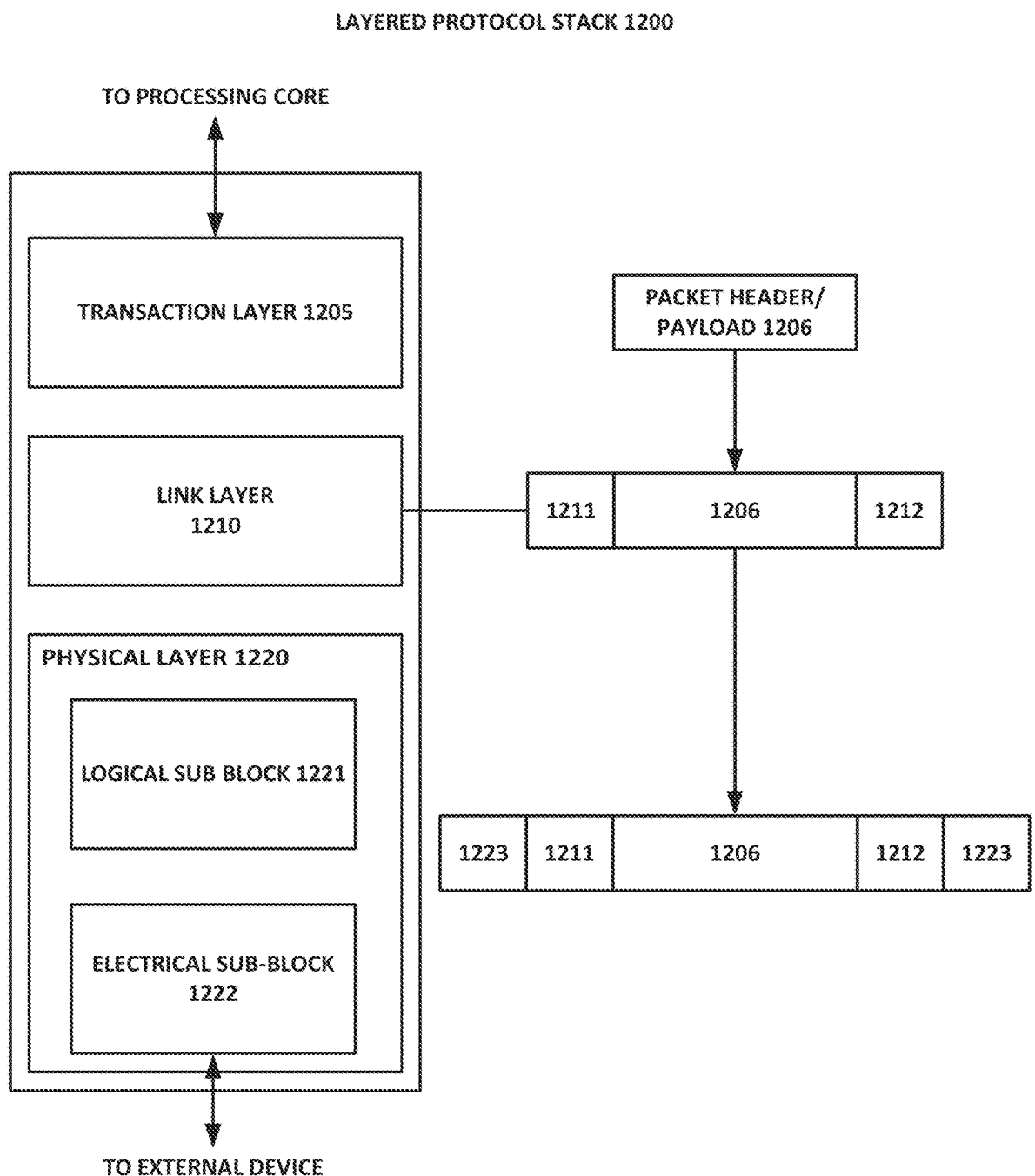
FIG. 12 is a block diagram of an example layered protocol stack.

FIG. 12 is a block diagram of an example layered protocol stack 1200. Embodiments of layered protocol stack 1200 disclosed herein may be adapted or configured to provide a high-speed ADC, according to the teachings of the present specification.

Layered protocol stack 1200 includes any form of a layered communication stack, such as an Intel® QuickPath Interconnect (QPI) stack, a PCIe stack, a next generation HPC interconnect stack, or other layered stack. In one embodiment, protocol stack 1200 is a PCIe protocol stack including transaction layer 1205, link layer 1210, and physical layer 1220. Representation as a communication protocol stack may also be referred to as a module or interface implementing/including a protocol stack.

PCIe uses packets to communicate information between components. Packets are formed in the transaction layer 1205 and data link layer 1210 to carry the information from the transmitting component to the receiving component. As the transmitted packets flow through the other layers, they are extended with additional information necessary to handle packets at those layers. At the receiving side the reverse process occurs and packets get transformed from their physical layer 1220 representation to the data link layer 1210 representation and finally (for transaction layer packets) to the form that can be processed by the transaction layer 1205 of the receiving device.

Transaction Layer

In one embodiment, transaction layer 1205 is to provide an interface between a device's processing core and the interconnect architecture, such as data link layer 1210 and physical layer 1220. In this regard, a primary responsibility of the transaction layer 1205 is the assembly and disassembly of packets, i.e., transaction layer packets (TLPs). The translation layer 1205 typically manages credit-based flow control for TLPs. PCIe implements split transactions, i.e., transactions with request and response separated by time, allowing a link to carry other traffic while the target device gathers data for the response.

In addition, PCIe utilizes credit-based flow control. In this scheme, a device advertises an initial amount of credit for each of the receive buffers in transaction layer 1205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more read requests and write requests to transfer data to/from a memory-mapped location. In one embodiment, memory space transactions are capable of using two different address formats, e.g., a short address format, such as a 32-bit address, or a long address format, such as a 64-bit address. Configuration space transactions are used to access configuration space of PCIe devices. Transactions to the configuration space include read requests and write requests. Message space transactions (more simply referred to as messages) are defined to support in-band communication between PCIe agents.

Therefore, in one embodiment, transaction layer 1205 assembles packet header/payload 1206. Format for current packet headers/payloads may be found in the PCIe specification at the PCIe specification website.

FIG. 13 is a block diagram illustrating selected components of a data center 1300 with network connectivity. Embodiments of data center 1300 disclosed herein may be adapted or configured to provide a high-speed ADC, according to the teachings of the present specification.

Data center 1300 is disclosed in this illustration as a data center operated by a CSP 1302, but this is an illustrative example only. The principles illustrated herein may also be applicable to an HPC cluster, a smaller "edge" data center, a microcloud, or other interconnected compute structure.

CSP 1302 may be, by way of nonlimiting example, a traditional enterprise data center, an enterprise "private cloud," or a "public cloud," providing services such as infrastructure as a service (IaaS), platform as a service (PaaS), or software as a service (SaaS). In some cases, CSP 1302 may provide, instead of or in addition to cloud services, HPC platforms or services. Indeed, while not expressly identical, HPC clusters ("supercomputers") may be structurally similar to cloud data centers, and unless expressly specified, the teachings of this specification may be applied to either. In general usage, the "cloud" is considered to be separate from an enterprise data center. Whereas an enterprise data center may be owned and operated on-site by an enterprise, a CSP provides third-party compute services to a plurality of "tenants." Each tenant may be a separate user or enterprise, and may have its own allocated resources, service-level agreements (SLAB), and similar.

CSP 1302 may provision some number of workload clusters 1318, which may be clusters of individual servers, blade servers, rackmount servers, or any other suitable server topology. In this illustrative example, two workload clusters, 1318-1 and 1318-2 are shown, each providing rackmount servers 1346 in a chassis 1348.

In this illustration, workload clusters 1318 are shown as modular workload clusters conforming to the rack unit ("U") standard, in which a standard rack, 19 inches wide, may accommodate up to 42 units (42 U), each 1.75 inches high and approximately 36 inches deep. In this case, compute resources such as processors, memory, storage, accelerators, and switches may fit into some multiple of rack units from 1 U to 42 U.

In the case of a more traditional rack-based data center, each server 1346 may host a standalone operating system and provide a server function, or servers may be virtualized, in which case they may be under the control of a virtual machine manager (VMM), hypervisor, and/or orchestrator. Each server may then host one or more virtual machines, virtual servers, or virtual appliances. These server racks may be collocated in a single data center, or may be located in different geographic data centers. Depending on contractual agreements, some servers 1346 may be specifically dedicated to certain enterprise clients or tenants, while others may be shared.

The various devices in a data center may be connected to each other via a switching fabric 1370, which may include one or more high-speed routing and/or switching devices. Switching fabric 1370 may provide both "north-south" traffic (e.g., traffic to and from the wide area network (WAN), such as the Internet), and "east-west" traffic (e.g., traffic across the data center). Historically, north-south traffic accounted for the bulk of network traffic, but as web services become more complex and distributed, the volume of east-west traffic has risen. In many data centers, east-west traffic now accounts for the majority of traffic.

Furthermore, as the capability of each server 1346 increases, traffic volume may further increase. For example, each server 1346 may provide multiple processor slots, with each slot accommodating a processor having four to eight cores, along with sufficient memory for the cores. Thus, each server may host a number of virtual machines (VMs), each generating its own traffic.

To accommodate the large volume of traffic in a data center, a highly capable switching fabric 1370 may be provided. As used throughout this specification, a "fabric" should be broadly understood to include any combination of physical interconnects, protocols, media, and support resources that provide communication between one or more first discrete devices and one or more second discrete devices. Fabrics may be one-to-one, one-to-many, many-to-one, or many-to-many.

In some embodiments, fabric 1370 may provide communication services on various "layers," as outlined in the Open Systems Interconnection (OSI) seven-layer network model. In contemporary practice, the OSI model is not followed strictly. In general terms, layers 1 and 2 are often called the "Ethernet" layer (though in some data centers or supercomputers, Ethernet may be supplanted or supplemented by newer technologies). Layers 3 and 4 are often referred to as the transmission control protocol/internet protocol (TCP/IP) layer (which may be further sub-divided into TCP and IP layers). Layers 5-7 may be referred to as the "application layer." These layer definitions are disclosed as a useful framework, but are intended to be nonlimiting.

Switching fabric 1370 is illustrated in this example as a "flat" network, wherein each server 1346 may have a direct connection to a top-of-rack (ToR) switch 1320 (e.g., a "star" configuration). Note that ToR is a common and historical name, and ToR switch 1320 may, in fact, be located anywhere on the rack. Some data centers place ToR switch 1320 in the middle of the rack to reduce the average overall cable length.

Each ToR switch 1320 may couple to a core switch 1330. This two-tier flat network architecture is shown only as an illustrative example. In other examples, other architectures may be used, such as three-tier star or leaf-spine (also called "fat tree" topologies) based on the "Clos" architecture, hub-and-spoke topologies, mesh topologies, ring topologies, or 3-D mesh topologies, by way of nonlimiting example.

The fabric itself may be provided by any suitable interconnect. For example, each server 1346 may include an Intel® Host Fabric Interface (HFI), a network interface card (NIC), intelligent NIC (iNIC), smart NIC, a host channel adapter (HCA), or other host interface. For simplicity and unity, these may be referred to throughout this specification as a "fabric adapter" (FA), which should be broadly construed as an interface to communicatively couple the host to the data center fabric. The FA may couple to one or more host processors via an interconnect or bus, such as PCI, PCIe, or similar, referred to herein as a "local fabric." Multiple processor may communicate with one another via a special interconnects such as a core-to-core Intel® UltraPath Interconnect (UPI), Infinity Fabric, etc. Generically, these interconnects may be referred to as an "inter-processor fabric." The treatment of these various fabrics may vary from vendor to vendor and from architecture to architecture. In some cases, one or both of the local fabric and the inter-processor fabric may be treated as part of the larger data center fabric 1372. Some FAs have the capability to dynamically handle a physical connection with a plurality of protocols (e.g., either Ethernet or PCIe, depending on the context), in which case PCIe connections to other parts of a rack may usefully be treated as part of fabric 1372. In other embodiments, PCIe is used exclusively within a local node, sled, or sled chassis, in which case it may not be logical to treat the local fabric as part of data center fabric 1372. In yet other embodiments, it is more logically to treat the inter-processor fabric as part of the secure domain of the processor complex, and thus treat it separately from the local fabric and/or data center fabric 1372. In particular, the inter-processor fabric may be cache and/or memory-coherent, meaning that coherent devices can map to the same memory address space, with each treating that address space as its own local address space. Many data center fabrics and local fabrics lack coherency, and so it may be beneficial to treat inter-processor fabric, the local fabric, and the data center fabric as one cohesive fabric, or two or three separate fabrics. Furthermore, the illustration of three levels of fabric in this example should not be construed to exclude more or fewer levels of fabrics, or the mixture of other kinds of fabrics. For example, many data centers use copper interconnects for short communication distances, and fiber optic interconnects for longer distances.

Thus, fabric 1370 may be provided by a single interconnect or a hybrid interconnect, such as where PCIe provides on-chip (for a system-on-a-chip) or on-board communication, 1 Gb or 10 Gb copper Ethernet provides relatively short connections to a ToR switch 1320, and optical cabling provides relatively longer connections to core switch 1330. Interconnect technologies that may be found in the data center include, by way of nonlimiting example, Intel® silicon photonics, an Intel® HFI, a NIC, intelligent NIC (iNIC), smart NIC, an HCA or other host interface, PCI, PCIe, a core-to-core UPI (formerly called QPI or KTI), Infinity Fabric, Intel® Omni-Path™ Architecture (OPA), TrueScale™, FibreChannel, Ethernet, FibreChannel over Ethernet (FCoE), InfiniBand, a legacy interconnect such as a local area network (LAN), a token ring network, a synchronous optical network (SONET), an asynchronous transfer mode (ATM) network, a wireless network such as Wi-Fi or Bluetooth, a "plain old telephone system" (POTS) interconnect or similar, a multi-drop bus, a mesh interconnect, a point-to-point interconnect, a serial interconnect, a parallel bus, a coherent (e.g., cache coherent) bus, a layered protocol architecture, a differential bus, or a Gunning transceiver logic (GTL) bus, to name just a few. The fabric may be cache- and memory-coherent, cache- and memory-non-coherent, or a hybrid of coherent and non-coherent interconnects. Some interconnects are more popular for certain purposes or functions than others, and selecting an appropriate fabric for the instant application is an exercise of ordinary skill. For example, OPA and Infiniband are commonly used in HPC applications, while Ethernet and FibreChannel are more popular in cloud data centers. But these examples are expressly nonlimiting, and as data centers evolve fabric technologies similarly evolve.

Note that while high-end fabrics such as OPA are provided herein by way of illustration, more generally, fabric 1370 may be any suitable interconnect or bus for the particular application. This could, in some cases, include legacy interconnects like LANs, token ring networks, synchronous optical networks (SONET), ATM networks, wireless networks such as Wi-Fi and Bluetooth, POTS interconnects, or similar. It is also expressly anticipated that in the future, new network technologies may arise to supplement or replace some of those listed here, and any such future network topologies and technologies can be or form a part of fabric 1370.

Figure 14:
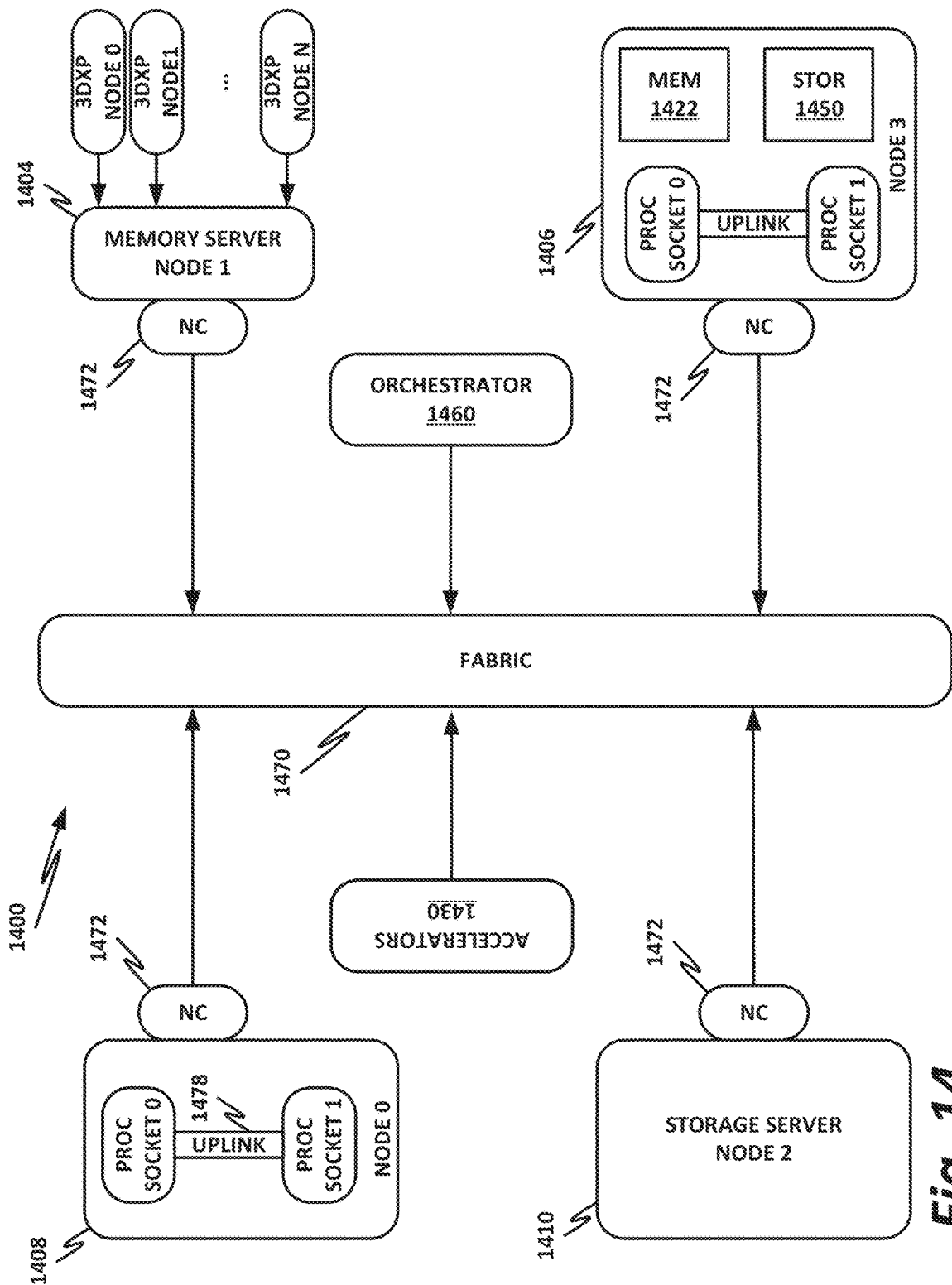
FIG. 14 is a block diagram illustrating selected components of an end-user computing device.

FIG. 14 is a block diagram illustrating selected components of an end-user computing device 1400. Embodiments of computing device 1400 disclosed herein may be adapted or configured to provide a high-speed ADC, according to the teachings of the present specification.

As above, computing device 1400 may provide, as appropriate, cloud service, HPC, telecommunication services, enterprise data center services, or any other compute services that benefit from a computing device 1400.

In this example, a fabric 1470 is provided to interconnect various aspects of computing device 1400. Fabric 1470 may be the same as fabric 1370 of FIG. 13, or may be a different fabric. As above, fabric 1470 may be provided by any suitable interconnect technology. In this example, Intel® Omni-Path™ is used as an illustrative and nonlimiting example.

As illustrated, computing device 1400 includes a number of logic elements forming a plurality of nodes. It should be understood that each node may be provided by a physical server, a group of servers, or other hardware. Each server may be running one or more virtual machines as appropriate to its application.

Node 0 1408 is a processing node including a processor socket 0 and processor socket 1. The processors may be, for example, Intel® Xeon™ processors with a plurality of cores, such as 4 or 8 cores. Node 0 1408 may be configured to provide network or workload functions, such as by hosting a plurality of virtual machines or virtual appliances.

On-board communication between processor socket 0 and processor socket 1 may be provided by an on-board uplink 1478. This may provide a very high-speed, short-length interconnect between the two processor sockets, so that virtual machines running on node 0 1408 can communicate with one another at very high speeds. To facilitate this communication, a virtual switch (vSwitch) may be provisioned on node 0 1408, which may be considered to be part of fabric 1470.

Node 0 1408 connects to fabric 1470 via a network controller (NC) 1472. NC 1472 provides physical interface (a PHY level) and logic to communicatively couple a device to a fabric. For example, NC 1472 may be a NIC to communicatively couple to an Ethernet fabric or an HFI to communicatively couple to a clustering fabric such as an Intel® Omni-Path™, by way of illustrative and nonlimiting example. In some examples, communication with fabric 1470 may be tunneled, such as by providing UPI tunneling over Omni-Path™.

Because computing device 1400 may provide many functions in a distributed fashion that in previous generations were provided on-board, a highly capable NC 1472 may be provided. NC 1472 may operate at speeds of multiple gigabits per second, and in some cases may be tightly coupled with node 0 1408. For example, in some embodiments, the logic for NC 1472 is integrated directly with the processors on a system-on-a-chip (SoC). This provides very high-speed communication between NC 1472 and the processor sockets, without the need for intermediary bus devices, which may introduce additional latency into the fabric. However, this is not to imply that embodiments where NC 1472 is provided over a traditional bus are to be excluded. Rather, it is expressly anticipated that in some examples, NC 1472 may be provided on a bus, such as a PCIe bus, which is a serialized version of PCI that provides higher speeds than traditional PCI. Throughout computing device 1400, various nodes may provide different types of NCs 1472, such as on-board NCs and plug-in NCs. It should also be noted that certain blocks in an SoC may be provided as IP blocks that can be "dropped" into an integrated circuit as a modular unit. Thus, NC 1472 may in some cases be derived from such an IP block.

Note that in "the network is the device" fashion, node 0 1408 may provide limited or no on-board memory or storage. Rather, node 0 1408 may rely primarily on distributed services, such as a memory server and a networked storage server. On-board, node 0 1408 may provide only sufficient memory and storage to bootstrap the device and get it communicating with fabric 1470. This kind of distributed architecture is possible because of the very high speeds of contemporary data centers, and may be advantageous because there is no need to over-provision resources for each node. Rather, a large pool of high-speed or specialized memory may be dynamically provisioned between a number of nodes, so that each node has access to a large pool of resources, but those resources do not sit idle when that particular node does not need them.

In this example, a node 1 memory server 1404 and a node 2 storage server 1410 provide the operational memory and storage capabilities of node 0 1408. For example, memory server node 1 1404 may provide remote direct memory access (RDMA), whereby node 0 1408 may access memory resources on node 1 1404 via fabric 1470 in a direct memory access fashion, similar to how it would access its own on-board memory. The memory provided by memory server 1404 may be traditional memory, such as double data rate type 3 (DDR3) dynamic random access memory (DRAM), which is volatile, or may be a more exotic type of memory, such as a persistent fast memory (PFM) like Intel® 3D Crosspoint™ (3DXP), which operates at DRAM-like speeds, but is non-volatile.

Similarly, rather than providing an on-board hard disk for node 0 1408, a storage server node 2 1410 may be provided. Storage server 1410 may provide a networked bunch of disks (NBOD), PFM, redundant array of independent disks (RAID), redundant array of independent nodes (RAIN), network-attached storage (NAS), optical storage, tape drives, or other non-volatile memory solutions.

Thus, in performing its designated function, node 0 1408 may access memory from memory server 1404 and store results on storage provided by storage server 1410. Each of these devices couples to fabric 1470 via an NC 1472, which provides fast communication that makes these technologies possible.

By way of further illustration, node 3 1406 is also depicted. Node 3 1406 also includes an NC 1472, along with two processor sockets internally connected by an uplink. However, unlike node 0 1408, node 3 1406 includes its own on-board memory 1422 and storage 1450. Thus, node 3 1406 may be configured to perform its functions primarily on-board, and may not be required to rely upon memory server 1404 and storage server 1410. However, in appropriate circumstances, node 3 1406 may supplement its own on-board memory 1422 and storage 1450 with distributed resources similar to node 0 1408.

Computing device 1400 may also include accelerators 1430. These may provide various accelerated functions, including hardware or co-processor acceleration for functions such as packet processing, encryption, decryption, compression, decompression, network security, or other accelerated functions in the data center. In some examples, accelerators 1430 may include deep learning accelerators that may be directly attached to one or more cores in nodes such as node 0 1408 or node 3 1406. Examples of such accelerators can include, by way of nonlimiting example, Intel® QuickData Technology (QDT), Intel® QuickAssist Technology (QAT), Intel® Direct Cache Access (DCA), Intel® Extended Message Signaled Interrupt (MSI-X), Intel® Receive Side Coalescing (RSC), and other acceleration technologies.

In other embodiments, an accelerator could also be provided as an application-specific integrated circuit (ASIC), field-programmable gate array (FPGA), co-processor, graphics processing unit (GPU), digital signal processor (DSP), or other processing entity, which may optionally be tuned or configured to provide the accelerator function.

The basic building block of the various components disclosed herein may be referred to as "logic elements." Logic elements may include hardware (including, for example, a software-programmable processor, an ASIC, or an FPGA), external hardware (digital, analog, or mixed-signal), software, reciprocating software, services, drivers, interfaces, components, modules, algorithms, sensors, components, firmware, microcode, programmable logic, or objects that can coordinate to achieve a logical operation. Furthermore, some logic elements are provided by a tangible, non-transitory computer-readable medium having stored thereon executable instructions for instructing a processor to perform a certain task. Such a non-transitory medium could include, for example, a hard disk, solid state memory or disk, read-only memory (ROM), PFM (e.g., Intel® 3D Crosspoint™), external storage, RAID, RAIN, NAS, optical storage, tape drive, backup system, cloud storage, or any combination of the foregoing by way of nonlimiting example. Such a medium could also include instructions programmed into an FPGA, or encoded in hardware on an ASIC or processor.

Figure 15:
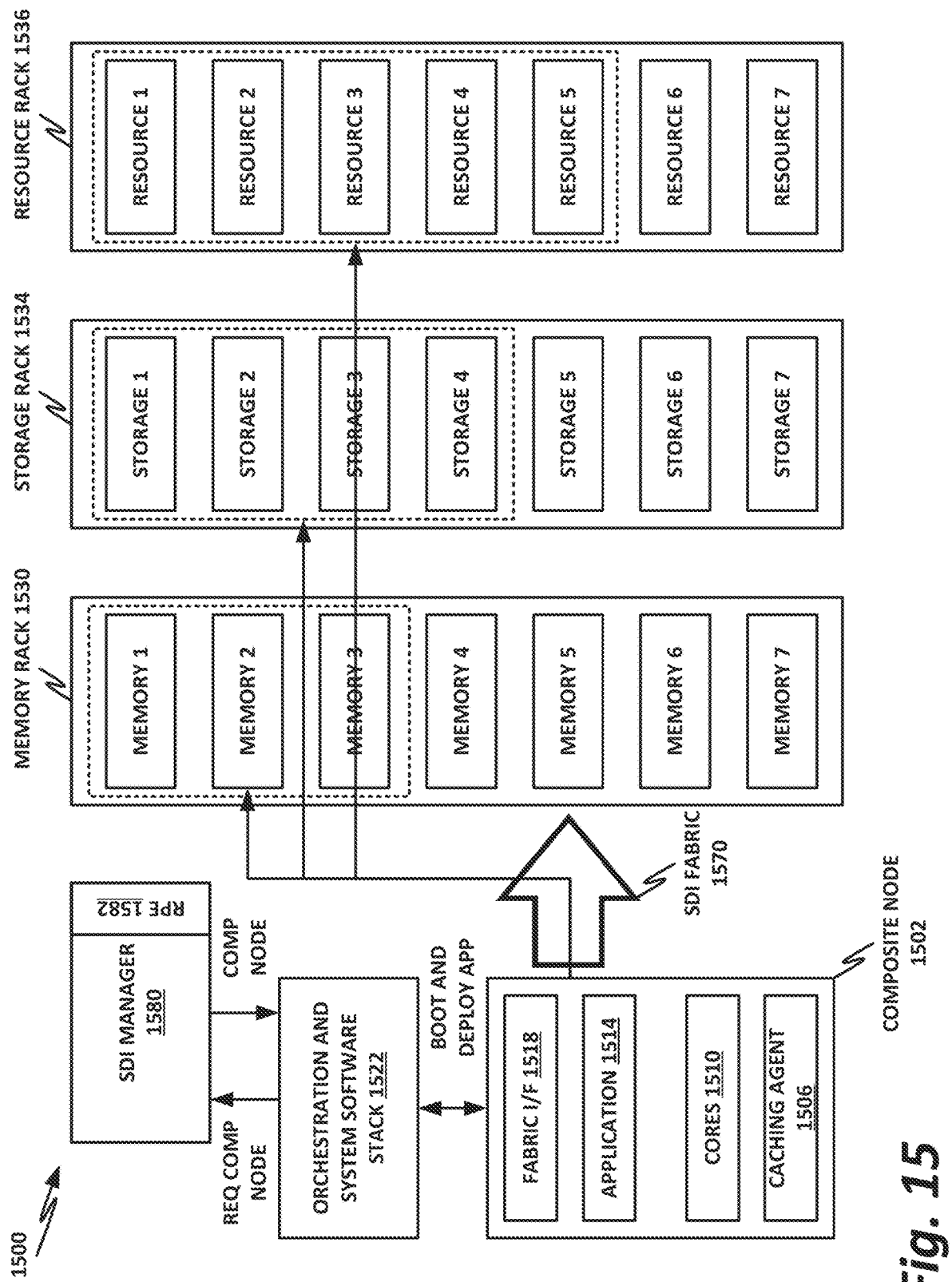
FIG. 15 is a block diagram of a software-defined infrastructure (SDI) data center.

FIG. 15 is a block diagram of a software-defined infrastructure (SDI) data center 1500. Embodiments of SDI data center 1500 disclosed herein may be adapted or configured to provide a high-speed ADC, according to the teachings of the present specification. Certain applications hosted within SDI data center 1500 may employ a set of resources to achieve their designated purposes, such as processing database queries, serving web pages, or providing computer intelligence.

Certain applications tend to be sensitive to a particular subset of resources. For example, SAP HANA is an in-memory, column-oriented relational database system. A SAP HANA database may use processors, memory, disk, and fabric, while being most sensitive to memory and processors. In one embodiment, composite node 1502 includes one or more cores 1510 that perform the processing function. Node 1502 may also include caching agents 1506 that provide access to high-speed cache. One or more applications 1514 run on node 1502, and communicate with the SDI fabric via FA 1518. Dynamically provisioning resources to node 1502 may include selecting a set of resources and ensuring that the quantities and qualities provided meet required performance indicators, such as service-level agreements (SLAB) and quality of service (QoS). Resource selection and allocation for application 1514 may be performed by a resource manager, which may be implemented within orchestration and system software stack 1522. By way of nonlimiting example, throughout this specification the resource manager may be treated as though it can be implemented separately or by an orchestrator. Note that many different configurations are possible.

In an SDI data center, applications may be executed by a composite node such as node 1502 that is dynamically allocated by SDI manager 1580. Such nodes are referred to as composite nodes because they are not nodes where all of the resources are necessarily collocated. Rather, they may include resources that are distributed in different parts of the data center, dynamically allocated, and virtualized to the specific application 1514.

In this example, memory resources from three memory sleds from memory rack 1530 are allocated to node 1502, storage resources from four storage sleds from storage rack 1534 are allocated, and additional resources from five resource sleds from resource rack 1536 are allocated to application 1514 running on composite node 1502. All of these resources may be associated to a particular compute sled and aggregated to create the composite node. Once the composite node is created, the operating system may be booted in node 1502, and the application may start running using the aggregated resources as if they were physically collocated resources. As described above, FA 1518 may provide certain interfaces that enable this operation to occur seamlessly with respect to node 1502.

As a general proposition, the more memory and compute resources that are added to a database processor, the better throughput it can achieve. However, this is not necessarily true for the disk or fabric. Adding more disk and fabric bandwidth may not necessarily increase the performance of the SAP HANA database beyond a certain threshold.

SDI data center 1500 may address the scaling of resources by mapping an appropriate amount of offboard resources to the application based on application requirements provided by a user or network administrator or directly by the application itself. This may include allocating resources from various resource racks, such as memory rack 1530, storage rack 1534, and resource rack 1536.

In an example, SDI controller 1580 also includes a resource protection engine (RPE) 1582, which is configured to assign permission for various target resources to disaggregated compute resources (DRCs) that are permitted to access them. In this example, the resources are expected to be enforced by an FA servicing the target resource.

In certain embodiments, elements of SDI data center 1500 may be adapted or configured to operate with the disaggregated telemetry model of the present specification.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid state drive, a flash memory, or other non-volatile medium. A computer-readable medium could also include a medium such as a ROM, an FPGA, or an ASIC configured to carry out the desired instructions, stored instructions for programming an FPGA or ASIC to carry out the desired instructions, an intellectual property (IP) block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a central processing unit (CPU) package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

Example Implementations

The following examples are provided by way of illustration.

Example 1 includes a communication apparatus, comprising: an analog data source; a digital communication interface; and an analog-to-digital converter (ADC) circuit assembly, comprising: an analog sample input; an input clock to provide frequency $f_{in}$; a time-interleaved front end to interleave n samples of the analog sample input; and an ADC array comprising n successive-approximation register (SAR) ADCs, the SAR ADCs comprising self-clocked comparators and configured to operate at a frequency no less than $$\frac{f_{in}}{n}.$$

Example 2 includes the communication apparatus of example 1, wherein the self-clocked comparators are single-bit comparators.

Example 3 includes the communication apparatus of example 1, wherein the SAR ADCs are sub-2 radix SAR ADCs.

Example 4 includes the communication apparatus of example 1, further comprising n most significant bit (MSB) asynchronous memory cells.

Example 5 includes the communication apparatus of example 4, wherein the MSB asynchronous memory cells are clocked by trigger inputs from the self-clocked comparators.

Example 6 includes the communication apparatus of example 5, wherein the MSB asynchronous memory cells are configured to operate with a period less than a period of the self-clocked comparators.

Example 7 includes the communication apparatus of example 4, further comprising capacitor digital-to-analog converters (DACs) to drive the MSB asynchronous memory cells.

Example 8 includes the communication apparatus of example 7, wherein the capacitor DACs comprise two capacitors per bit sample.

Example 9 includes the communication apparatus of example 1, wherein the analog sample input is a differential voltage.

Example 10 includes the communication apparatus of example 1, further comprising a clock conditioning circuit to sample the input clock at the rising and falling edge, to provide $f_{in}$ at twice the input clock.

Example 11 includes the communication apparatus of example 10, wherein the input clock is 32 gigahertz (GHz).

Example 12 includes the communication apparatus of example 1, wherein the time-interleaved front end comprises a multiplexed switching network.

Example 13 includes an analog-to-digital converter (ADC), comprising: an analog data source; an analog input; an input clock; and a front end to time interleave samples from the analog input to an ADC array comprising an array of successive-approximation register (SAR) ADCs, the SAR ADCs comprising self-clocked comparators that operate at a frequency substantially less than the input clock.

Example 14 includes the ADC of example 13, wherein the self-clocked comparators are single-bit comparators.

Example 15 includes the ADC of example 13, wherein the SAR ADCs are sub-2 radix SAR ADCs.

Example 16 includes the ADC of example 13, further comprising an asynchronous memory cell per SAR ADC.

Example 17 includes the ADC of example 16, wherein the asynchronous memory cells are clocked by trigger inputs from the self-clocked comparators.

Example 18 includes the ADC of example 17, wherein the asynchronous memory cells are configured to operate with a period less than a period of the self-clocked comparators.

Example 19 includes the ADC of example 16, further comprising capacitor digital-to-analog converters (DACs) to drive the asynchronous memory cells.

Example 20 includes the ADC of example 19, wherein the capacitor DACs comprise two capacitors per bit sample.

Example 21 includes the ADC of example 13, wherein the analog sample input is a differential voltage.

Example 22 includes the ADC of example 13, further comprising a clock conditioning circuit to sample the input clock at the rising and falling edge.

Example 23 includes the ADC of example 22, wherein the input clock is 32 gigahertz (GHz).

Example 24 includes the ADC of example 13, wherein the time-interleaved front end comprises a multiplexed switching network.

Example 25 includes a method of providing analog-to-digital conversion, comprising: receiving an analog input; receiving an input clock; time interleaving samples from the analog input to an ADC array comprising an array of successive-approximation register (SAR) ADCs, the SAR ADCs comprising self-clocked comparators that operate at a frequency substantially less than the input clock.

Example 26 includes the method of example 25, wherein the self-clocked comparators are single-bit comparators.

Example 27 includes the method of example 25, wherein the SAR ADCs are sub-2 radix SAR ADCs.

Example 28 includes the method of example 25, further comprising an asynchronous memory cell per SAR ADC.

Example 29 includes the method of example 28, wherein the asynchronous memory cells are clocked by trigger inputs from the self-clocked comparators.

Example 30 includes the method of example 29, wherein the asynchronous memory cells are configured to operate with a period less than a period of the self-clocked comparators.

Example 31 includes the method of example 25, wherein the analog sample input is a differential voltage.

Example 32 includes the method of example 25, further comprising sampling the input clock at the rising and falling edge.

Example 33 includes the method of example 25, wherein the input clock is 32 gigahertz (GHz).

Example 34 includes the method of example 25, wherein the time-interleaved front end comprises a multiplexed switching network.

What is claimed is:

1. A communication apparatus, comprising:
an analog data source;
a digital communication interface; and
an analog-to-digital converter (ADC) circuit assembly, comprising:
an analog sample input;
an input clock to provide frequency $f_{in}$;
a time-interleaved front end to interleave n samples of the analog sample input; and
an ADC array comprising n sub-2 radix successive-approximation register (SAR) ADCs, the SAR ADCs comprising self-clocked comparators and configured to operate at a frequency no less than $$\frac{f_{in}}{n}.$$

2. The communication apparatus of claim 1, wherein the self-clocked comparators are single-bit comparators.

3. The communication apparatus of claim 1, further comprising n most-significant-bit (MSB) asynchronous memory cells.

4. The communication apparatus of claim 3, wherein the MSB asynchronous memory cells are clocked by trigger inputs from the self-clocked comparators.

5. The communication apparatus of claim 4, wherein the MSB asynchronous memory cells are configured to operate with a period less than a period of the self-clocked comparators.

6. The communication apparatus of claim 3, further comprising capacitor digital-to-analog converters (DACs) to drive the MSB asynchronous memory cells.

7. The communication apparatus of claim 6, wherein the capacitor DACs comprise two capacitors per bit sample.

8. The communication apparatus of claim 1, wherein the analog sample input is a differential voltage.

9. The communication apparatus of claim 1, further comprising a clock conditioning circuit to sample the input clock at the rising and falling edge, to provide $f_{in}$ at twice the input clock.

10. The communication apparatus of claim 9, wherein the input clock is 32 gigahertz (GHz).

11. The communication apparatus of claim 1, wherein the time-interleaved front end comprises a multiplexed switching network.

12. An analog-to-digital converter (ADC), comprising:
an analog data source;
an analog input;
an input clock; and
a front end to time interleave samples from the analog input to an ADC array comprising an array of sub-2 radix successive-approximation register (SAR) ADCs, the SAR ADCs comprising self-clocked comparators that operate at a frequency substantially less than the input clock.

13. The ADC of claim 12, wherein the self-clocked comparators are single-bit comparators.

14. The ADC of claim 12, further comprising an asynchronous memory cell per SAR ADC.

15. The ADC of claim 14, wherein the asynchronous memory cells are clocked by trigger inputs from the self-clocked comparators.

16. The ADC of claim 15, wherein the asynchronous memory cells are configured to operate with a period less than a period of the self-clocked comparators.

17. A method of providing analog-to-digital conversion, comprising:
receiving an analog input;
receiving an input clock;
time interleaving samples from the analog input to an ADC array comprising an array of sub-2 radix successive-approximation register (SAR) ADCs, the SAR ADCs comprising self-clocked comparators that operate at a frequency substantially less than the input clock.

18. The method of claim 17, wherein the self-clocked comparators are single-bit comparators.

19. The method of claim 17, further comprising driving an asynchronous memory cell per SAR ADC.

20. The method of claim 19, further comprising clocking the asynchronous memory cells by trigger inputs from the self-clocked comparators.

* * * * *